United States Patent
Masunaga et al.

(10) Patent No.: US 8,859,181 B2
(45) Date of Patent: *Oct. 14, 2014

(54) CHEMICALLY AMPLIFIED NEGATIVE RESIST COMPOSITION AND PATTERNING PROCESS

(75) Inventors: Keiichi Masunaga, Joetsu (JP); Satoshi Watanabe, Joetsu (JP); Jun Hatakeyama, Joetsu (JP); Youichi Ohsawa, Joetsu (JP); Daisuke Domon, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 690 days.

This patent is subject to a terminal disclaimer.

(21) Appl. No.: 13/033,647

(22) Filed: Feb. 24, 2011

(65) Prior Publication Data

US 2011/0212390 A1 Sep. 1, 2011

(30) Foreign Application Priority Data

Feb. 26, 2010 (JP) ................................ 2010-041472

(51) Int. Cl.
   G03F 7/004 (2006.01)
   G03F 7/033 (2006.01)
   G03F 7/26 (2006.01)
   G03F 7/038 (2006.01)
   G03F 1/00 (2012.01)

(52) U.S. Cl.
   CPC ............ *G03F 7/0382* (2013.01); *G03F 7/0046* (2013.01); *G03F 7/0045* (2013.01); *G03F 1/14* (2013.01); *Y10S 430/11* (2013.01); *Y10S 430/111* (2013.01)
   USPC ......... 430/270.1; 430/909; 430/910; 430/322

(58) Field of Classification Search
   USPC ............. 430/270.1, 326–400, 913, 914, 909, 430/910, 921, 922, 925, 927
   See application file for complete search history.

(56) References Cited

U.S. PATENT DOCUMENTS

| | | | |
|---|---|---|---|
| 6,485,883 B2 | 11/2002 | Kodama et al. | |
| 7,569,326 B2 | 8/2009 | Ohsawa et al. | |
| 8,632,939 B2 * | 1/2014 | Masunaga et al. ......... | 430/270.1 |
| 2006/0166133 A1 | 7/2006 | Koitabashi et al. | |
| 2008/0096128 A1 | 4/2008 | Takeda et al. | |
| 2008/0102407 A1 | 5/2008 | Ohsawa et al. | |
| 2008/0220371 A1 * | 9/2008 | Kodama .................... | 430/281.1 |
| 2008/0241751 A1 | 10/2008 | Takeda et al. | |
| 2008/0311507 A1 | 12/2008 | Isono et al. | |

FOREIGN PATENT DOCUMENTS

| | | | |
|---|---|---|---|
| CN | 1825206 A | | 8/2006 |
| CN | 101387831 A | | 3/2009 |
| EP | 0473547 A1 | | 3/1992 |
| EP | 1684118 A1 | | 7/2006 |
| EP | 1975711 A1 | * | 10/2008 |
| JP | 4-230645 A | | 8/1992 |
| JP | 9-309874 A | | 12/1997 |
| JP | 2001-281849 A | | 10/2001 |
| JP | 2005-084365 A | | 3/2005 |
| JP | 2006-201532 A | | 8/2006 |
| JP | 2006-215180 A | | 8/2006 |
| JP | 2008-102383 A | | 5/2008 |
| JP | 2008-133448 A | | 6/2008 |
| JP | 2008-249762 A | | 10/2008 |
| JP | 2009-019199 A | | 1/2009 |
| WO | 2010-119910 A1 | | 10/2010 |
| WO | WO 2010119910 A1 | * | 10/2010 |

OTHER PUBLICATIONS

European Search Report dated May 30, 2011, issued in corresponding European Patent Application No. 11001591.4.

* cited by examiner

*Primary Examiner* — Anca Eoff

(74) *Attorney, Agent, or Firm* — Westerman, Hattori, Daniels & Adrian, LLP

(57) ABSTRACT

A chemically amplified negative resist composition is provided comprising (A) an alkali-soluble base polymer, (B) an acid generator, and (C) a nitrogen-containing compound, the base polymer (A) turning alkali insoluble under the catalysis of acid. A polymer having a fluorinated carboxylic acid onium salt on a side chain is included as the base polymer. Processing the negative resist composition by a lithography process may form a resist pattern with advantages including uniform low diffusion of acid, improved LER, and reduced substrate poisoning.

10 Claims, No Drawings

CHEMICALLY AMPLIFIED NEGATIVE RESIST COMPOSITION AND PATTERNING PROCESS

CROSS-REFERENCE TO RELATED APPLICATION

This non-provisional application claims priority under 35U.S.C. §119(a) on Patent Application No. 2010-041472 filed in Japan on Feb. 26, 2010, the entire contents of which are hereby incorporated by reference.

TECHNICAL FIELD

This invention relates to a chemically amplified negative resist composition, typically for use in processing of semiconductor and photomask substrates, and a patterning process using the same.

BACKGROUND ART

In the recent drive for higher integration and operating speeds in LSI devices, it is desired to miniaturize the pattern rule. The exposure process and the resist composition are largely altered to meet such a demand. Particularly when resist patterns with a feature size of 0.2 μm or less are formed by lithography, KrF and ArF excimer laser radiation, electron beam (EB) or the like is used as the light source for exposure, and chemically amplified resist compositions having a high sensitivity to such high-energy radiation and affording a high resolution are used as the photoresist.

Resist compositions include positive ones in which exposed areas are dissolved away and negative ones in which exposed areas are left as a pattern. A suitable composition is selected among them depending on the desired resist pattern. In general, the chemically amplified negative resist composition comprises a polymer which is normally soluble in an aqueous alkaline developer, an acid generator which is decomposed to generate an acid upon exposure to light, and a crosslinker which causes the polymer to crosslink in the presence of the acid serving as a catalyst, thus rendering the polymer insoluble in the developer (sometimes, the crosslinker is incorporated in the polymer). Typically a basic compound is added for controlling the diffusion of the acid generated upon light exposure.

A number of negative resist compositions of the type comprising a polymer which is soluble in an aqueous alkaline developer and includes phenolic units as the alkali-soluble units were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the EB and EUV lithography capable of forming finer size patterns. Exemplary compositions are described in Patent Documents 1 to 3.

In the course of development of resist compositions as mentioned above, the resist compositions are required to exhibit not only a high resolution which is the fundamental function of a resist film, but also high etch resistance. This is because the resist film must be thinned as the pattern feature size is reduced. One known means for achieving such high etch resistance is by introducing a polycyclic compound containing aromatic ring and non-aromatic ring wherein the non-aromatic ring has a carbon-carbon double bond conjugated to the aromatic ring, like indene or acenaphthylene, into a hydroxystyrene-based polymer as an auxiliary component. This is disclosed in Patent Document 3.

On the other hand, a number of acid generators have also been developed for use in chemically amplified resist compositions. Many examples are described in Patent Documents 1 to 3. Patent Document 4 discloses an acid generator capable of generating carboxylic acid having fluorinated hydrocarbon substituent. Patent Document 5 describes an acid generator capable of generating a polymer-bound sulfonic acid.

CITATION LIST

Patent Document 1: JP-A 2006-201532 (US 20060166133, EP 1684118, CN 1825206)
Patent Document 2: JP-A 2006-215180
Patent Document 3: JP-A 2008-249762 (US 2008241751, EP 1975711, CN 101387831)
Patent Document 4: JP-A 2001-281849
Patent Document 5: JP-A 2008-133448 (U.S. Pat. No. 7,569,326)
Patent Document 6: JP-A 2008-102383 (US 2008096128)

DISCLOSURE OF INVENTION

To meet the increasing demand for a pattern of finer feature size, efforts have been made to improve the negative resist composition of the ordinary type using an acid generator. As the pattern feature size is reduced to a very fine size of 0.1 μm or less, some problems become more outstanding, for example, a bridge problem that a resist layer in thin thread form is left between pattern features, and a reduced line edge roughness (LER). The conventional resist compositions fail to overcome these problems.

The phenomenon that the material of a processable substrate causes a resist pattern to change its profile near the substrate is known as the "substrate poisoning" problem, which becomes more serious. Even a small profile change becomes significant as the feature size of the desired pattern is reduced. This is true particularly when a photomask blank having a chromium oxynitride layer as the outermost surface is processed. A chemically amplified negative resist composition is coated on the chromium oxynitride layer of the photomask blank to form a resist film, which is patterned. During the process, the resist pattern is notched at its contact with the substrate, which is known as the "undercut" problem. The undercut problem is not fully overcome by conventional resist compositions.

An object of the invention is to provide a chemically amplified negative resist composition adapted to form a pattern featuring reduced LER and minimized substrate poisoning, and a patterning process using the same.

The inventors have found that when a polymer having a carboxylic acid salt on a side chain is used as an acidic compound in a chemically amplified negative resist composition, it contributes to reductions of LER and substrate poisoning.

In one aspect, the invention provides a chemically amplified negative resist composition comprising (A) a base polymer which is soluble in an aqueous alkaline developer, (B) an acid generator capable of generating an acid catalyst, and (C) a nitrogen-containing compound as a basic component, said base polymer as component (A) turning alkali insoluble under the action of the acid catalyst in the presence or absence of a crosslinker. A polymer comprising recurring units of a fluorinated carboxylic acid onium salt having the general formula (1) and having a weight average molecular weight of 1,000 to 50,000 is included as at least a portion of the base polymer.

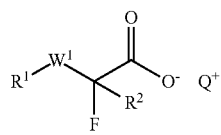
(1)

Herein $R^1$ is a structure derived from a basis skeleton capable of providing the polymerization activity of a polymerizable monomer, represented by any one of the formulae:

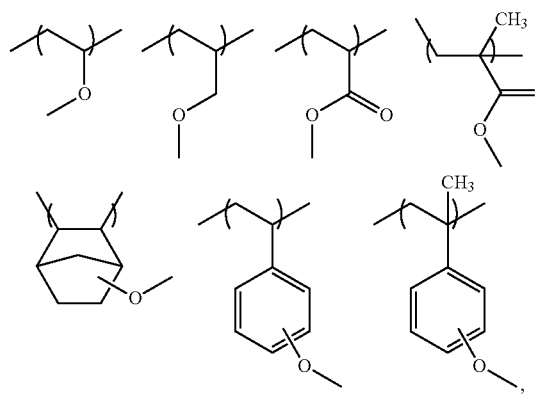

wherein the valence bond extending from the oxygen atom in the structure designates a bond to $W^1$, $R^2$ is fluorine or a fluoroalkyl group, $W^1$ is a divalent organic group, and $Q^+$ is a sulfonium cation of the general formula (a) or (b) or a iodonium cation of the general formula (c).

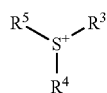
(a)

Herein $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom.

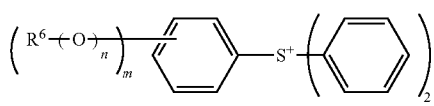
(b)

Herein $R^6$ is a substituted or unsubstituted, straight, branched or cyclic $C_1$-$C_{20}$ alkyl or alkenyl group or a substituted or unsubstituted $C_6$-$C_{14}$ aryl group, m is an integer of 1 to 5, n is 0 or 1, $R^6$ may have a carbonyl group, hydroxyl group, ester structure, lactone structure, amino group, amide group or ether-bonding oxygen atom substituted thereon.

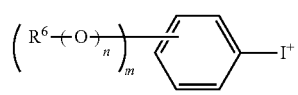
(c)

Herein $R^6$, m and n are as defined above.

In a preferred embodiment, the recurring units of a fluorinated carboxylic acid onium salt having the general formula (1) are recurring units of a fluorinated carboxylic acid onium salt having the general formula (2).

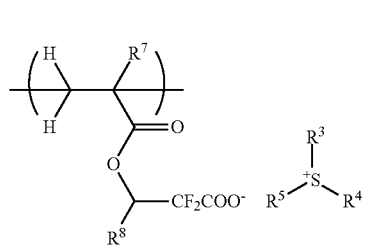
(2)

Herein $R^7$ is hydrogen or methyl, $R^8$ is hydrogen or $C_1$-$C_6$ alkyl, $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom.

In a preferred embodiment, the polymer comprising recurring units of a fluorinated carboxylic acid onium salt further comprises units having the general formula (3).

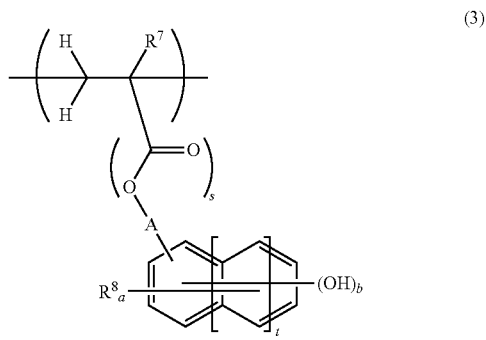
(3)

Herein $R^7$ is hydrogen or methyl, A is a single bond or a $C_1$-$C_{10}$ alkylene group which may be separated by an ether bond, $R^8$ is each independently hydrogen or $C_1$-$C_6$ alkyl, a is an integer of 0 to 4, b is an integer of 1 to 5, s is 0 or 1, and t is an integer of 0 to 2.

In a preferred embodiment, the polymer comprising recurring units of a fluorinated carboxylic acid onium salt further comprises units having the general formula (4).

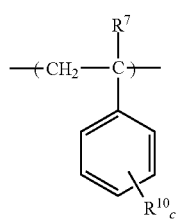

(4)

Herein $R^7$ is hydrogen or methyl, $R^{10}$ is selected from the group consisting of hydrogen, halogen, optionally halo-substituted $C_1$-$C_8$ alkyl or alkoxy groups, alicyclic groups, aromatic groups, and optionally halo-substituted $C_2$-$C_8$ alkylcarbonyloxy groups, and c is an integer of 1 to 5.

The resist composition may further comprise a polymer free of recurring units of formula (1) as a portion of the base polymer.

The resist composition may further comprise a crosslinker which reacts with component (A) in the presence of the acid catalyst for turning component (A) alkali insoluble.

In another aspect, the invention provides a pattern forming process comprising the steps of applying the negative resist composition defined above onto a processable substrate to form a resist film, exposing the film patternwise to high-energy radiation, and developing the exposed film with an alkaline developer to form a resist pattern.

Most often, the high-energy radiation is EUV or electron beam. In a preferred embodiment, the processable substrate comprises a chromium-containing material at the outermost surface. Typically, the processable substrate is a photomask blank.

Advantageous Effects of Invention

A polymer comprising recurring units of a fluorinated carboxylic acid onium salt having formula (1) is used as a portion of base polymer to formulate a chemically amplified negative resist composition. When the composition is used in a lithography process of forming a negative resist pattern which is required to have a ultrafine size, the diffusion of acid in the resist film is more uniform and lower, whereby the pattern is improved in LER and minimized in substrate poisoning.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The terminology "($C_x$-$C_y$)", as applied to a particular unit, such as, for example, a chemical compound or a chemical substituent group, means having a carbon atom content of from "x" carbon atoms to "y" carbon atoms per such unit.

The acronym UV stands for ultraviolet, DUV for deep ultraviolet, EUV for extreme ultraviolet, EB for electron beam, PEB for post-exposure bake, PAG for photoacid generator, and LER for line edge roughness.

Examples of chemically amplified negative resist compositions are well known as described, for example, in Patent Documents 1 to 3. Typical chemically amplified negative resist compositions comprise a base polymer which is soluble in an aqueous alkaline developer, an acid generator, and a crosslinker. Their pattern forming mechanism is that the base polymer reacts with the crosslinker under the catalysis of a strong acid generated from the acid generator upon exposure to high-energy radiation and converts into a higher molecular weight polymer which is insoluble in the developer. If recurring units having a crosslinking function are incorporated into the base polymer, a resist composition capable of forming a pattern without a need for the crosslinker is available as described in Patent Document 6, for example.

The chemically amplified negative resist composition of the invention is to form a pattern through the above-mentioned mechanism. The composition is defined herein as comprising (A) a base polymer which is soluble in an aqueous alkaline developer, but turns insoluble therein through acid-catalyzed reaction, and/or a combination of a base polymer with a crosslinker, the base polymer being soluble in an aqueous alkaline developer, but turning insoluble therein through reaction with the crosslinker with the help of an acid catalyst, (B) an acid generator capable of generating an acid catalyst, and (C) a nitrogen-containing compound as a basic component. The composition is characterized in that a polymer comprising recurring units of a fluorinated carboxylic acid onium salt having the general formula (1) is included as at least a portion of the base polymer.

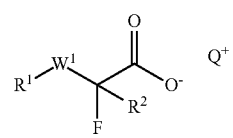

(1)

Herein $R^1$ is a structure derived from a basis skeleton capable of providing the polymerization activity of a polymerizable monomer, represented by any one of the formulae.

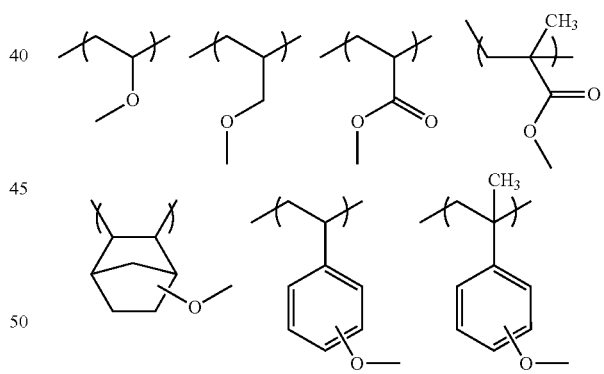

Notably the valence bond extending from the oxygen atom in the structure designates a bond to $W^1$. $R^2$ is fluorine or a fluoroalkyl group, $W^1$ is a divalent organic group, and $Q^+$ is a sulfonium cation of the general formula (a) or (b) or a iodonium cation of the general formula (c), which will be illustrated below.

In formula (1), $R^2$ is fluorine or a fluoroalkyl group. The fluoroalkyl groups are preferably of 1 to 12 carbon atoms, more preferably of 1 to 3 carbon atoms. Suitable fluoroalkyl groups include, but are not limited to, trifluoromethyl, pentafluoroethyl, 2,2,2-trifluoroethyl, n-heptafluoropropyl, 2,2,3,3,3-pentafluoropropyl, 3,3,3-trifluoropropyl, and hexafluoroisopropyl. Most preferably $R^2$ is fluorine or trifluoromethyl.

$W^1$ is a single bond or a divalent organic group which links $R^1$ (which is a structure derived from a basis skeleton capable of providing the polymerization activity of a polymerizable monomer) to a carboxylate structure in which α-carbon is substituted with one or more fluorine atoms. It is a linker bonding to ethereal oxygen atom.

The divalent organic group represented by $W^1$ is an optionally substituted methylene group (—$CR^xR^y$— wherein $R^x$ and $R^y$ are each independently an organic group or hydrogen, at least one of $R^x$ and $R^y$ being an organic group), an optionally substituted divalent alicyclic hydrocarbon group, an optionally substituted divalent aromatic hydrocarbon group, an optionally substituted divalent linking group (such as heterocyclic group), or a divalent linking group comprising any one of the foregoing linking groups, bonded with at least one group selected from among linking groups including ether-bonding oxygen atom, ether-bonding sulfur atom, carbonyl, carbonyloxy, oxycarbonyl, amide, sulfonamide, urethane, and urea groups. In the divalent linking group, any number of hydrogen atoms bonded to carbon atoms may be substituted by fluorine atoms, and at least one set of divalent or multivalent constituent atoms within the linking group (inclusive of substituent group) may bond together to form a ring.

In one embodiment wherein a substituted methylene group (—$CR^xR^y$—) is selected as linking group $W^1$ or a part of $W^1$, the substituent groups $R^x$ and $R^y$ are monovalent groups of 1 to 30 carbon atoms, selected from among halo- or hydroxy-substituted or unsubstituted alkyl groups, substituted or unsubstituted alicyclic hydrocarbon groups, alkoxy groups, substituted or unsubstituted aryl groups, and substituted or unsubstituted fused polycyclic aromatic groups. These monovalent groups may contain a fluorine, oxygen, sulfur, nitrogen atom or a carbon-carbon double bond.

In each of groups $R^x$ and $R^y$, at least one set of divalent or multivalent constituent atoms may bond together to form a ring. In this case, the ring is preferably an alicyclic hydrocarbon structure. The preferred monovalent organic groups represented by $R^x$ and $R^y$ include acyclic alkyl groups of 1 to 30 carbon atoms, preferably 1 to 12 carbon atoms, such as methyl, ethyl, n-propyl, i-propyl, n-butyl, 1-methylpropyl, 2-methylpropyl, tert-butyl, n-pentyl, i-pentyl, 1,1-dimethylpropyl, 1-methylbutyl, 1,1-dimethylbutyl, n-hexyl, n-heptyl, i-hexyl, n-octyl, i-octyl, 2-ethylhexyl, n-nonyl, n-decyl, n-undecyl, and n-dodecyl. Of these, lower alkyl groups are preferred, and methyl, ethyl, n-propyl and i-propyl are most preferred.

Where substituted acyclic alkyl groups are selected as $R^x$ and $R^y$, examples include those alkyl groups in which one or more hydrogen atoms are substituted by $C_1$-$C_4$ alkoxyl, halogen, acyl, acyloxy, cyano, hydroxyl, carboxyl, alkoxycarbonyl, or nitro groups. Of these, alkyl groups having fluorine substituted thereon, i.e., fluoroalkyl groups are preferred. Especially preferred are lower fluoroalkyl groups, for example, trifluoromethyl, pentafluoroethyl, 2,2,2-trifluoroethyl, n-heptafluoropropyl 2,2,3,3,3-pentafluoropropyl, 3,3,3-trifluoropropyl, and hexafluoroisopropyl.

Where alicyclic hydrocarbon groups or alicyclic hydrocarbon groups in which at least one set of divalent or multivalent constituent atoms in each of $R^x$ and $R^y$ bond together to form a ring are selected as $R^x$ and $R^y$, exemplary groups include monocyclic and polycyclic ones, for example, monocyclo, bicyclo, tricyclo and tetracyclo structures of at least 3 carbon atoms. The number of carbon atoms in the cyclic structure preferably ranges from 3 to 30, more preferably from 3 to 25. These alicyclic hydrocarbon groups may have a substituent group or groups. Monocyclic groups are preferably of 3 to 12 member carbon atoms, more preferably 3 to 7 member carbon atoms, and preferred examples thereof include cyclopropyl, cyclobutyl, cyclopentyl, cyclohexyl, cycloheptyl, cyclooctyl, cyclodecanyl, cyclododecanyl, and 4-tert-butylcyclohexyl. Suitable polycyclic groups include those of 7 to 15 member carbon atoms, for example, adamantyl, noradamantyl, decalin residue, tricyclodecanyl, tetracyclododecanyl, norbornyl, and cedrol. The alicyclic hydrocarbon groups may be spiro-system, preferably spiro-system of 3 to 6 carbon atoms. Preferred examples include adamantyl, decalin residue, norbornyl, cedrol, cyclohexyl, cycloheptyl, cyclooctyl, cyclodecanyl, cyclododecanyl, and tricyclodecanyl. Also included are the foregoing organic groups in which one or more of ring-forming carbons are each independently substituted with $C_1$-$C_{30}$ alkyl or substituted alkyl, hydroxyl, alkoxyl, carboxyl or alkoxycarbonyl, the foregoing linking groups in which one or more hydrogen atoms are each independently substituted by $C_1$-$C_{30}$ alkyl or substituted alkyl, hydroxyl, alkoxyl, carboxyl or alkoxycarbonyl, and the foregoing monocyclic groups in which one or more hydrogen atoms are substituted by fluorine or trifluoromethyl. In conjunction with these substituted groups, the $C_1$-$C_{30}$ alkyl groups are preferably lower alkyl groups and more preferably methyl, ethyl, propyl and isopropyl; the substituent groups on the substituted alkyl group include hydroxyl, halogen, and alkoxyl; the alkoxyl groups include those of 1 to 4 carbon atoms, such as methoxy, ethoxy, propoxy and butoxy; and the alkoxycarbonyl groups include methoxycarbonyl, ethoxycarbonyl and isopropoxycarbonyl.

Where alkoxyl is selected as $R^x$ and $R^y$, typical alkoxyl groups are of 1 to 4 carbon atoms, for example, methoxy, ethoxy, propoxy and butoxy.

Where substituted or unsubstituted aryl is selected as $R^x$ and $R^y$, typical aryl groups are monocyclic groups having 6 to 14 carbon atoms in the aromatic ring, more preferably 6 to 10 ring-forming carbon atoms. Examples include phenyl, biphenyl, terphenyl, o-tolyl, m-tolyl, p-tolyl, p-hydroxyphenyl, p-methoxyphenyl, mesityl, o-cumenyl, 2,3-xylyl, 2,4-xylyl, 2,5-xylyl, 2,6-xylyl, 3,4-xylyl, 3,5-xylyl, o-fluorophenyl, m-fluorophenyl, p-fluorophenyl, o-trifluoromethylphenyl, m-trifluoromethylphenyl, p-trifluoromethylphenyl, 2,3-bis-trifluoromethylphenyl, 2,4-bistrifluoromethylphenyl, 2,5-bistrifluoromethylphenyl, 2,6-bistrifluoromethylphenyl, 3,4-bistrifluoromethylphenyl, 3,5-bistrifluoromethylphenyl, p-chlorophenyl, p-bromophenyl, and p-iodophenyl. Also preferred are substituted or unsubstituted, fused polycyclic aromatic groups of up to 30 carbon atoms in the aromatic ring, for example, monovalent organic groups derived from pentalene, indene, naphthalene, azulene, heptalene, biphenylene, indacene, acenaphthylene, fluorene, phenalene, phenanthrene, anthracene, fluoracene, acephenanthrylene, aceanthrylene, triphenylene, pyrene, chrysene, naphthacene, picene, perylene, pentaphene, pentacene, tetraphenylene, hexaphene, hexacene, rubicene, coronene, trinaphthylene, heptaphene, heptacene, pyranthrene, and ovalene, by eliminating one hydrogen therefrom. Also preferred are such organic groups in which one or more hydrogen atoms are substituted by fluorine, $C_1$-$C_4$ alkyl or fluoroalkyl.

Where monocyclic or polycyclic heterocyclic groups are selected as $R^x$ and $R^y$, typical are monocyclic or polycyclic heterocyclic groups of 3 to 25 ring-forming atoms, preferably 4 to 14 ring-forming atoms. Examples include pyridyl, furyl, thienyl, pyranyl, pyrrolyl, thianthrenyl, pyrazolyl, isothiazolyl, isooxazolyl, pyradinyl, pyrimidinyl, pyridazinyl, tetrahydropyranyl, tetrahydrofuranyl, tetrahydrothiopyranyl, tetrahydrothiofuranyl, and 3-tetrahydrothiophene-1,1-dioxide. One or more hydrogen atoms on the ring-forming carbon atoms may be substituted by alkyl, alicyclic hydrocarbon, aryl, or heterocyclic groups. Most preferably groups having a monocyclic or polycyclic ether ring or lactone ring are selected as $R^x$ and $R^y$, and examples thereof are given below.

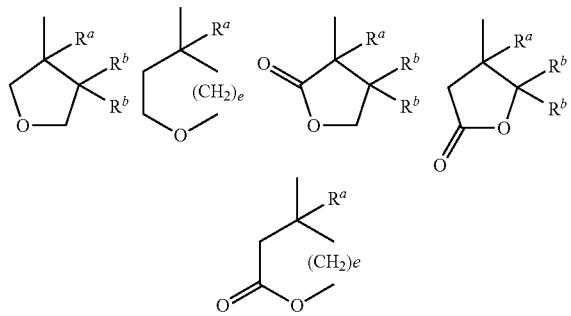

Herein $R^a$ and $R^b$ are each independently hydrogen or $C_1$-$C_4$ alkyl, and e is an integer of 2 to 4.

In another embodiment wherein a divalent alicyclic hydrocarbon group is selected as linking group $W^1$ or a part of $W^1$, it may be either monocyclic or polycyclic. Exemplary groups include monocyclo, bicyclo, tricyclo and tetracyclo structures of at least 3 carbon atoms. The number of carbon atoms in the cyclic structure preferably ranges from 3 to 30, more preferably from 3 to 25. These alicyclic hydrocarbon groups may have a substituent group or groups. Monocyclic groups are preferably of 3 to 12 member carbon atoms, more preferably 3 to 7 member carbon atoms, and preferred examples thereof include cyclopropylene, cyclobutylene, cyclopentylene, cyclohexylene, cycloheptylene, cyclooctylene, cyclodecanylene, cyclododecanylene, and 4-tert-butylcyclohexylene. Suitable polycyclic groups include those of 7 to 15 member carbon atoms, for example, adamantylene, noradamantylene, divalent decalin residue, tricyclodecanylene, tetracyclododecanylene, norbornylene, and divalent cedrol residue. The alicyclic hydrocarbon groups may be of spiro-system, preferably spiro-system of 3 to 6 carbon atoms. Also included are the foregoing organic groups in which one or more of ring-forming carbons are each independently substituted with $C_1$-$C_{30}$ alkyl or substituted alkyl, hydroxyl, alkoxyl, carboxyl or alkoxycarbonyl, and the foregoing linking groups in which one or more hydrogen atoms are each independently substituted by $C_1$-$C_{30}$ alkyl or substituted alkyl, hydroxyl, alkoxyl, carboxyl or alkoxycarbonyl. In conjunction with these substituted groups, the $C_1$-$C_{30}$ alkyl groups are preferably lower alkyl groups and more preferably methyl, ethyl, propyl and isopropyl; the substituent groups on the substituted alkyl group include hydroxyl, halogen, and alkoxyl; the alkoxyl groups include those of 1 to 4 carbon atoms, such as methoxy, ethoxy, propoxy and butoxy; and the alkoxycarbonyl groups include methoxycarbonyl, ethoxycarbonyl and isopropoxycarbonyl.

In a further embodiment wherein a divalent aromatic hydrocarbon group is selected as linking group $W^1$ or a part of $W^1$, monocyclic or polycyclic aromatic groups of 6 to 30 carbon atoms are typical. Monocyclic groups are preferably of 6 to 14 member carbon atoms, more preferably 6 to 10 member carbon atoms, and preferred examples thereof include divalent groups derived from benzene, biphenyl, terphenyl, toluene, phenol, anisole, mesitylene, cumene, 2,3-xylylene, 2,4-xylene, 2,5-xylene, 2,6-xylene, 3,4-xylene, 3,5-xylene, fluorobenzene, trifluoromethylbenzene, o-bistrifluoromethylbenzene, m-bistrifluoromethylbenzene, p-bistrifluoromethylbenzene, chlorobenzene, bromobenzene, and iodobenzene, by eliminating two hydrogen atoms therefrom. Fused polycyclic aromatic groups may be substituted or unsubstituted, and preferably of 8 to 30 carbon atoms, and preferred examples thereof include divalent groups derived from pentalene, indene, naphthalene, azulene, heptalene, biphenylene, indacene, acenaphthylene, fluorene, phenalene, phenanthrene, anthracene, fluoracene, acephenanthrylene, aceanthrylene, triphenylene, pyrene, chrysene, naphthacene, picene, perylene, pentaphene, pentacene, tetraphenylene, hexaphene, hexacene, rubicene, coronene, trinaphthylene, heptaphene, heptacene, pyranthrene, and ovalene, by eliminating two hydrogen atoms therefrom. Also preferred are such organic groups in which one or more hydrogen atoms are substituted by fluorine, $C_1$-$C_4$ alkyl or fluoroalkyl.

In a further embodiment wherein a heterocyclic group is selected as linking group $W^1$ or a part of $W^1$, monocyclic or polycyclic heterocyclic groups of 3 to 25 ring-forming atoms, preferably 4 to 14 ring-forming atoms are typical. The heterocyclic groups may be of aromatic or non-aromatic ring, and examples include divalent organic groups derived from pyridine, furan, thienine, pyranine, pyrroline, thianthrene, pyrazone, isothiazone, isooxazone, pyrazine, pyrimidine, pyridazine, tetrahydropyranine, tetrahydrofuranine, tetrahydrothiopyranine, and tetrahydrothiofuran, by eliminating two hydrogen atoms therefrom, as well as the foregoing groups in which one or more hydrogen atoms on the ring-forming carbon atoms are substituted by alkyl (preferably lower alkyl), alicyclic hydrocarbon, aryl or heterocyclic groups. Of these, monocyclic or polycyclic ether rings are preferred, examples of which are shown below.

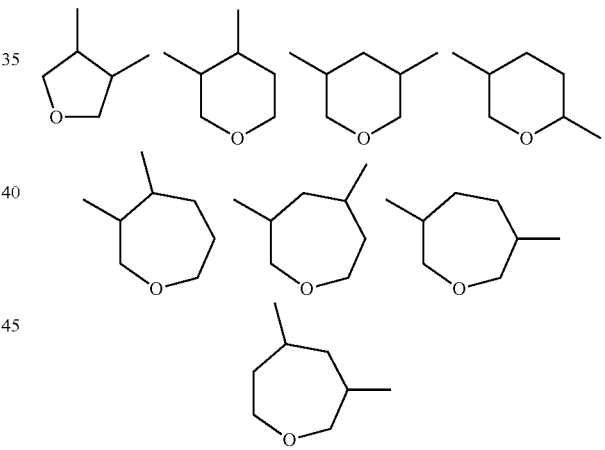

Further the linking group may be a combination of divalent groups illustrated above. It may also be a divalent linking group comprising any one of the foregoing linking groups, bonded with at least one group selected from among linking groups including ether-bonding oxygen atom, ether-bonding sulfur atom, carbonyl, ester, oxycarbonyl, amide, sulfonamide, urethane, and urea groups. Examples of the divalent linking group are shown below wherein O and C represent oxygen and carbon atoms, each adjoining a substituted methylene group, respectively.

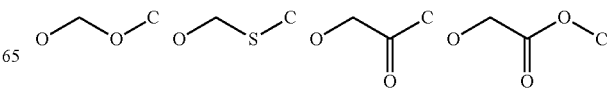

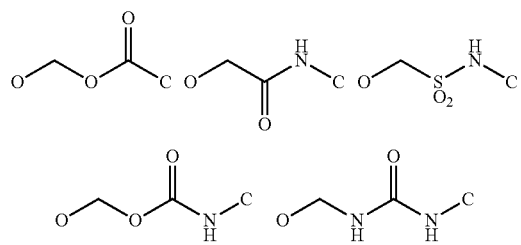

The most preferred linking group $W^1$ is a substituted methylene group. Preferred examples of the substituted methylene group are shown below wherein O and C represent oxygen and carbon atoms, each adjoining the substituted methylene group, respectively.

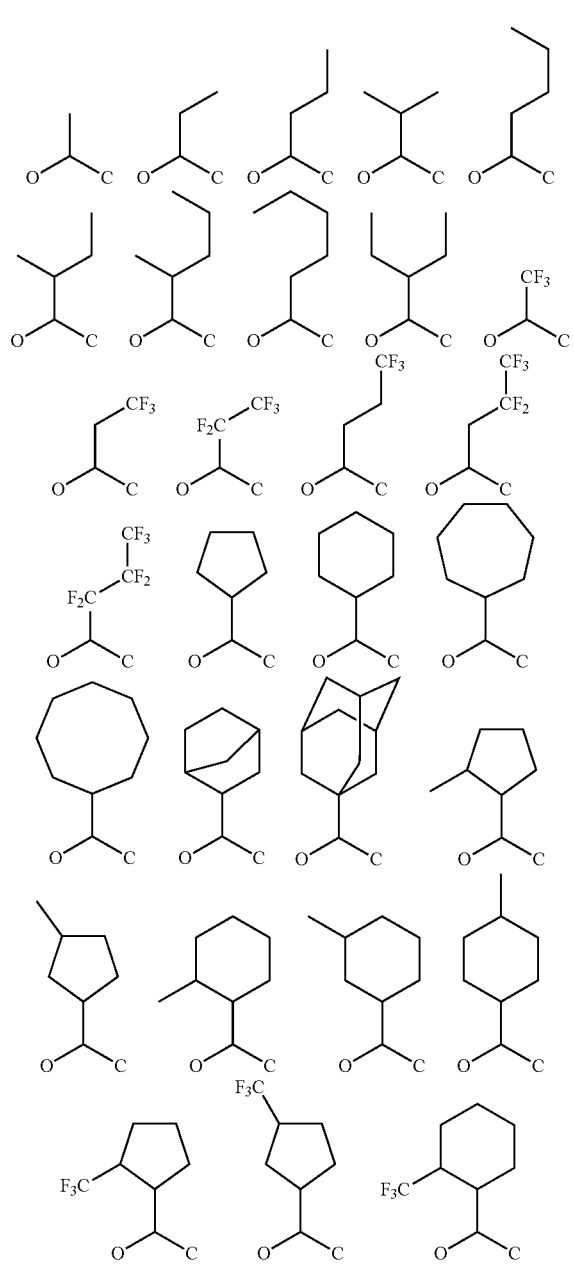

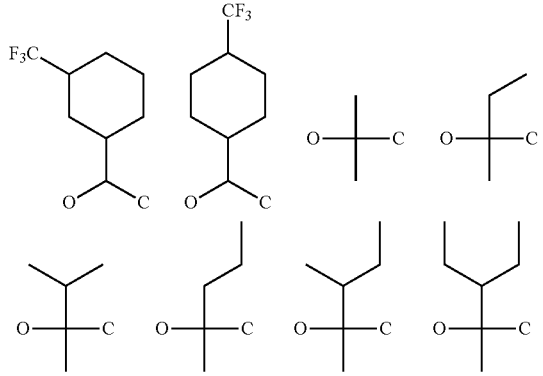

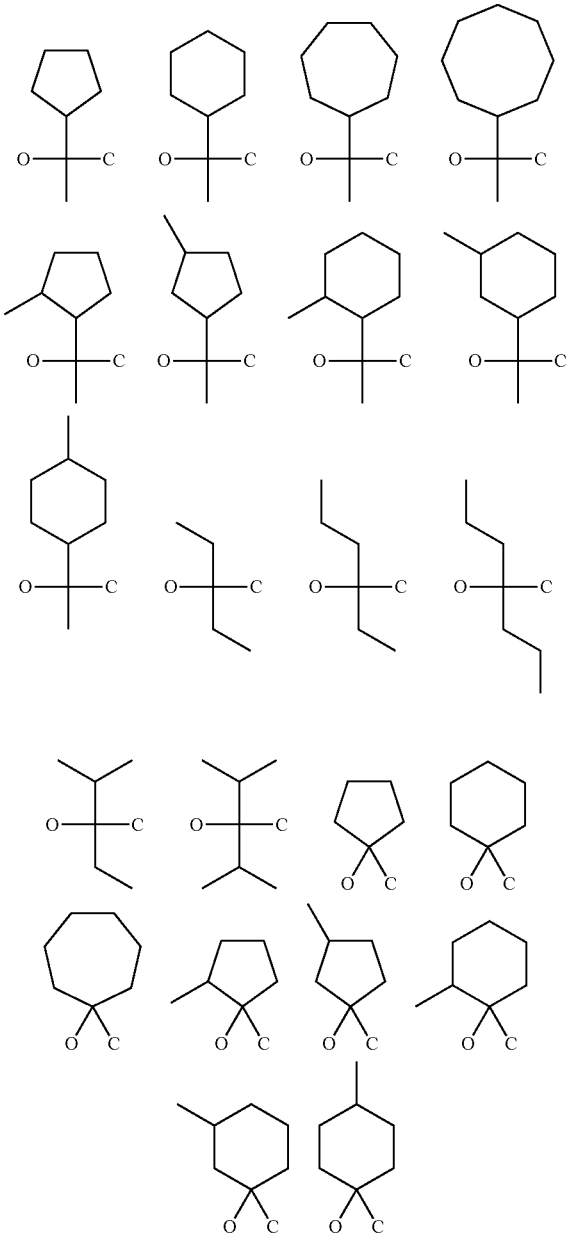

In formula (1), $Q^+$ is a sulfonium cation of the general formula (a) or (b) or a iodonium cation of the general formula (c). It is a counter cation to the carboxylate anion structure.

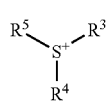
(a)

In formula (a), $R^3$, $R^4$ and $R^5$ are each independently an optionally substituted, straight or branched $C_1$-$C_{10}$ alkyl, alkenyl or oxoalkyl group or an optionally substituted $C_6$-$C_{18}$ aryl, aralkyl or aryloxoalkyl group, or any two or more of $R^3$, $R^4$ and $R^5$ may bond together to form a ring with the sulfur atom in the formula.

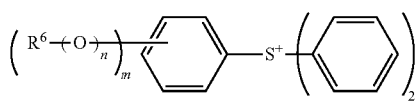
(b)

In formula (b), $R^6$ is an optionally substituted, straight, branched or cyclic $C_1$-$C_{20}$ alkyl or alkenyl group or an optionally substituted $C_6$-$C_{14}$ aryl group, m is an integer of 1 to 5, and n is 0 or 1. $R^6$ may have a carbonyl group, hydroxyl group, ester structure, lactone structure, amino group, amide group or ether-bonding oxygen atom substituted thereon.

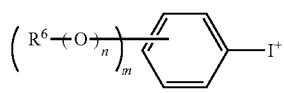
(c)

In formula (c), $R^6$ is an optionally substituted, straight, branched or cyclic $C_1$-$C_{20}$ alkyl or alkenyl group or an optionally substituted $C_6$-$C_{14}$ aryl group, m is an integer of 1 to 5, and n is 0 or 1. $R^6$ may have a carbonyl group, hydroxyl group, ester structure, lactone structure, amino group, amide group or ether-bonding oxygen atom substituted thereon.

In formulae (a) to (c), groups $R^3$ to $R^6$ may have a substituent group as mentioned above. Preferred substituent groups include a hydroxyl group, amino group, ester structure, lactone structure, amide group, alkyl group separated by an ether-bonding oxygen atom, and aryl group.

The fluorine atom represented by F in formula (1) serves to improve the thermal stability of the sulfonium salt. Upon exposure to high-energy radiation, the sulfonium moiety is photo-degraded to generate an acidic side chain having an acidity stronger than ordinary carboxylic acids and weaker than ordinary sulfonic acids.

Sulfonium Cation of Formula (a)

In formula (a), $R^3$, $R^4$ and $R^5$ are each independently an optionally substituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom. Suitable alkyl groups include methyl, ethyl, n-propyl, isopropyl, cyclopropyl, n-butyl, sec-butyl, isobutyl, tert-butyl, n-pentyl, cyclopentyl, n-hexyl, n-heptyl, 2-ethylhexyl, cyclohexyl, cycloheptyl, 4-methylcyclohexyl, cyclohexylmethyl, n-octyl, n-decyl, 1-adamantyl, 2-adamantyl, bicyclo[2.2.1]hepten-2-yl, 1-adamantanemethyl, and 2-adamantanemethyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, thienyl, alkoxyphenyl groups such as p-methoxyphenyl, m-methoxyphenyl, o-methoxyphenyl, p-ethoxyphenyl, p-tert-butoxyphenyl, m-tert-butoxyphenyl, alkylphenyl groups such as 2-methylphenyl, 3-methylphenyl, 4-methylphenyl and ethylphenyl, alkylnaphthyl groups such as methylnaphthyl and ethylnaphthyl, dialkylnaphthyl groups such as diethylnaphthyl, and dialkoxynaphthyl groups such as dimethoxynaphthyl and diethoxynaphthyl. Suitable aralkyl groups include benzyl, 1-phenylethyl and 2-phenylethyl. Suitable aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. When any two or more of $R^3$, $R^4$ and $R^5$ bond together to form a cyclic structure with the sulfur atom, typical ring-forming groups are 1,4-butylene and 3-oxa-1,5-pentylene. Exemplary cyclic structures are of the following formulae wherein the broken line designates the remaining one substituent group of $R^3$, $R^4$ and $R^5$.

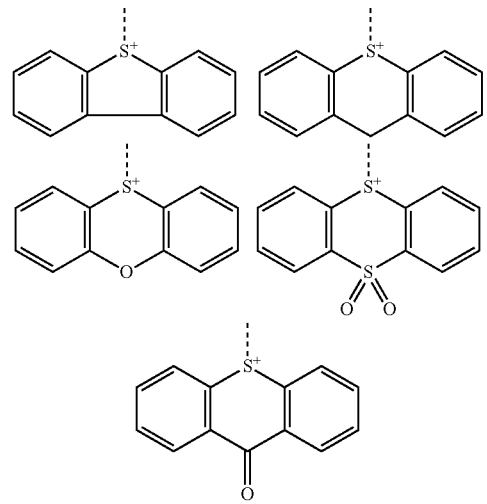

Also included are aryl groups having a polymerizable substituent group such as acryloyloxy or methacryloyloxy, for example, 4-(acryloyloxy)phenyl, 4-(methacryloyloxy)phenyl, 4-vinyloxyphenyl, and 4-vinylphenyl.

Illustrative examples of the sulfonium cation of formula (a) include triphenylsulfonium, (4-tert-butylphenyl)diphenylsulfonium, bis(4-tert-butylphenyl)phenylsulfonium, tris(4-tert-butylphenyl)sulfonium, (3-tert-butylphenyl)diphenylsulfonium, bis(3-tert-butylphenyl)phenylsulfonium, tris(3-tert-butylphenyl)sulfonium, (3,4-di-tert-butylphenyl)diphenylsulfonium, bis(3,4-di-tert-butylphenyl)phenylsulfonium, tris(3,4-di-tert-butylphenyl)sulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, (4-hydroxyphenyl)dimethylsulfonium, (4-methoxyphenyl)dimethylsulfonium, trimethylsulfonium, (2-oxocyclohexyl)cyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphthyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium.

Preferred cations are triphenylsulfonium, (4-tert-butylphenyl)diphenylsulfonium, (4-tert-butoxyphenyl)diphenylsulfonium, tris(4-tert-butylphenyl)sulfonium, (4-tert-butoxycarbonylmethyloxyphenyl)diphenylsulfonium, 5-phenyldibenzothiophenium, 5-(4-hydroxyphenyl)dibenzothiophenium, 5-(4-methylphenyl)dibenzothiophenium, 5-(4-t-butylphenyl)dibenzothiophenium, 10-phenylphenoxathiinium, 10-(4-hydroxyphenyl)phenoxathiinium, and 10-(4-tert-butoxyphenyl)phenoxathiinium, as well as sulfonium cations of the structure shown below.

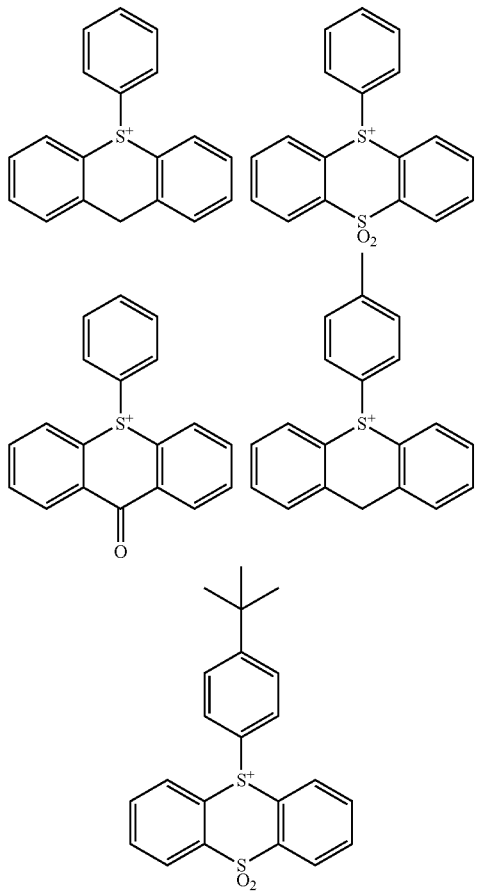

Also included are 4-(methacryloyloxy)phenyldiphenylsulfonium, 4-(acryloyloxy)phenyldiphenylsulfonium, 4-(methacryloyloxy)phenyldimethylsulfonium, and 4-(acryloyloxy) phenyldimethylsulfonium. With respect to the polymerizable sulfonium cations, reference may be made to JP-A H04-230645 and JP-A 2005-84365.

Sulfonium Cation of Formula (b)

In formula (b), the substitution position of $R^6$—$(O)_n$— group wherein n is 0 or 1 is not particularly limited, but is preferably 4- or 3-position on the phenyl group, and more preferably 4-position. Examples of groups represented by $R^6$ include methyl, ethyl, n-propyl, sec-propyl, cyclopropyl, n-butyl, sec-butyl, isobutyl, tert-butyl, n-pentyl, cyclopentyl, n-hexyl, cyclohexyl, n-octyl, n-decyl, n-dodecyl, 1-adamantyl, 2-adamantyl, bicyclo[2.2.1]hepten-2-yl, phenyl, 4-methoxyphenyl, 4-tert-butylphenyl, 4-biphenyl, 1-naphthyl, 2-naphthyl, 10-anthranyl, and 2-furanyl. In the case of n=1, acryloyl, methacryloyl, vinyl, and allyl are exemplary of $R^6$.

Illustrative examples of the sulfonium cation of formula (b) include (4-methylphenyl)diphenylsulfonium, (4-ethylphenyl)diphenylsulfonium, (4-cyclohexylphenyl)diphenylsulfonium, (4-n-hexylphenyl)diphenylsulfonium, (4-n-octylphenyl)diphenylsulfonium, (4-methoxyphenyl)diphenylsulfonium, (4-ethoxyphenyl)diphenylsulfonium, (4-tert-butoxyphenyl)diphenylsulfonium, (4-cyclohexyloxyphenyl)diphenylsulfonium, (4-trifluoromethylphenyl)diphenylsulfonium, (4-trifluoromethyloxyphenyl)diphenylsulfonium, and (4-tert-butoxycarbonylmethyloxyphenyl)diphenylsulfonium.

Iodonium Cation of Formula (c)

In formula (c), the substitution position of $R^6$—$(O)_n$— group wherein n is 0 or 1 is not particularly limited, but is preferably 4- or 3-position on the phenyl group, and more preferably 4-position. Examples of groups represented by $R^6$ are as exemplified for $R^6$ in formula (b).

Illustrative examples of the iodonium cation of formula (c) include bis(4-methylphenyl)iodonium, bis(4-ethylphenyl)iodonium, bis(4-tert-butylphenyl)iodonium, bis(4-(1,1-dimethylpropyl)phenyl)iodonium, (4-methoxyphenyl)phenyliodonium, (4-tert-butoxyphenyl)phenyliodonium, (4-acryloyloxyphenyl)phenyliodonium, and (4-methacryloyloxyphenyl)phenyliodonium, with the bis(4-tert-butylphenyl)iodonium being preferred.

In formula (1), $R^1$ is a structure derived from a basis skeleton capable of providing the polymerization activity of a polymerizable monomer, i.e., a structure represented by any one of the above formulae, specifically a vinyl ether structure, allyl ether structure, acrylic acid ester structure, methacrylic acid ester structure, norbornene ether structure or styrene ether structure. With respect to polymerization reaction using a monomer having a polymerization active basis skeleton providing the structure $R^1$, many processes for the synthesis of polymers for use in chemically amplified resist compositions are known in the art. Monomers having an acrylate or methacrylate structure are preferred because polymers are readily obtainable therefrom.

In a preferred embodiment, the recurring units of formula (1) of which the inventive polymer is composed are recurring units having the general formula (2).

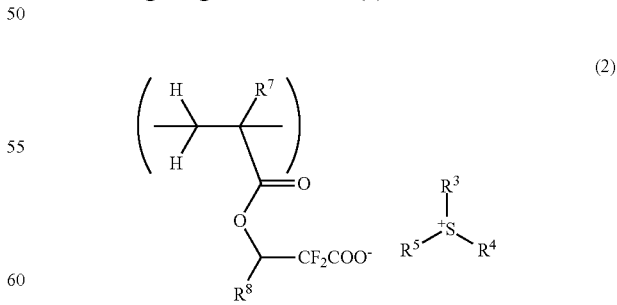

(2)

Herein $R^7$ is hydrogen or methyl; $R^8$ is hydrogen or $C_1$-$C_6$ alkyl; $R^3$, $R^4$ and $R^5$ are as defined above.

In formula (2), $R^8$ is hydrogen or a $C_1$-$C_6$ alkyl group which is typically selected from among methyl, ethyl, propyl, butyl, pentyl, hexyl, and structural isomers of a carbon skeleton having branched or cyclic structure. Alkyl groups having more than 6 carbon atoms are undesirable because the solubility of a polymer in alkaline developer is reduced and a combination with some other recurring units may cause formation of scum after development.

It is noted that a monomer which provides the recurring units of formula (1) via polymerization is an onium salt of a fluorinated carboxylic acid derivative as mentioned above. Since various methods are already known for the synthesis of fluorinated carboxylic acids and onium salts, the monomer can be obtained by combining these methods. For example, a method for the synthesis of an acrylic acid derivative having a fluorocarboxylic acid pendant is disclosed in JP-A 2009-19199 wherein an ethyl ester form of fluorinated carboxylic acid is hydrolyzed into a carboxylic acid under mild hydrolysis conditions. Also, a method for the synthesis of a new sulfonium salt from a starting sulfonium salt via salt exchange is disclosed in JP-A H09-309874 wherein salt exchange takes place between sulfonium chloride or bromide and the sodium or potassium salt of sulfonic acid. With these teachings borne in mind, the relevant monomer can be prepared by using a monomer having a fluorinated carboxylic acid pendant, converting it into an alkali metal salt, and effecting salt exchange between the alkali metal salt and a sulfonium salt having the desired structure.

When a resist film is formed from a chemically amplified negative resist composition comprising a polymer comprising recurring units of formula (1) as at least a portion of the base polymer and processed to form a resist pattern, the invention is successful in reducing LER and substantially restraining the occurrence of undercut due to substrate poisoning which is a common problem among chemically amplified negative resist films, as mentioned above. Although the reason is not well understood, it is believed that these advantages are attributable to the function of recurring units of formula (1). Since recurring units of formula (1) have an acid generator-like structure, the sulfonium structure is degraded, upon patternwise exposure to high-energy radiation, to produce a neutral substance and a carboxylic acid which is fluorinated at α-carbon. However, it is believed that the carboxylic acid fluorinated at α-carbon does not make a great contribution as a negative-tone reaction catalyst unlike Patent Document 4, as will be demonstrated by the following result.

In most high-resolution resist compositions, an amine is generally added as a basic substance for controlling diffusion of acid serving as a catalyst. In the resist composition of the invention, a high resolution is achievable without a need for amine. This is because the recurring unit of formula (1) serves as a basic component in a substantial sense. If sulfonic acid generated from the acid generator is present in proximity to the recurring unit of formula (1), an exchange takes place between hydrogen of sulfonic acid and a sulfonium cation to form a sulfonic acid-sulfonium salt and a carboxylic acid fluorinated at α-carbon. Although Patent Document 4 relates to a positive resist composition and indicates in Examples that carboxylic acid fluorinated at α-carbon works as an acid catalyst and an alkylcarboxylic acid does not work as a catalyst, it is believed that in the resist composition of the invention, carboxylic acid fluorinated at α-carbon does not work as an acid catalyst. The effects of improving edge roughness and restraining substrate poisoning are obtainable because the sulfonium salt of α-carbon-fluorinated carboxylic acid which functions as a basic component in a substantial sense is bound to the polymer.

The polymer may comprise other recurring units in addition to the recurring units of formula (1). Since the effects of the invention are exerted by the recurring units of formula (1), the other recurring units may be selected from all the recurring units known for use in chemically amplified negative resist compositions.

For example, when the polymer is an aromatic skeleton-bearing polymer for use in resist compositions for KrF, EB and EUV lithography, recurring units having the general formula (3) may preferably be used as the recurring unit for providing adhesion, solubility in alkaline developer, and reactivity with a crosslinkable functional group.

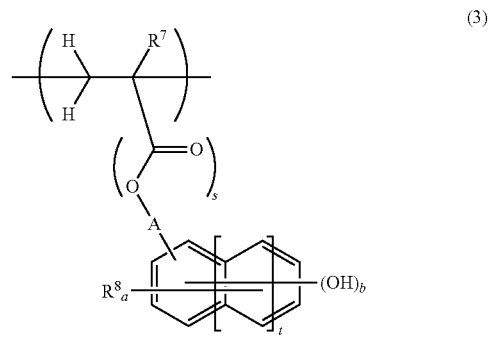

Herein $R^7$ is hydrogen or methyl, A is a single bond or a $C_1$-$C_{10}$ alkylene group which may be separated by an ether bond, $R^8$ is each independently hydrogen or $C_1$-$C_6$ alkyl, a is an integer of 0 to 4, b is an integer of 1 to 5, s is 0 or 1, and t is an integer of 0 to 2.

In formula (3), A is a single bond or a $C_1$-$C_{10}$ alkylene group which may be separated by an ethereal oxygen atom (or ether bond). Preferred examples of the alkylene group include methylene, ethylene, propylene, butylene, pentylene, hexylene, and structural isomers of a carbon skeleton having branched or cyclic structure. For the alkylene group containing an ethereal oxygen atom, where s in formula (3) is 1, the ethereal oxygen may be incorporated at any position excluding the position between α- and β-carbons relative to the ester oxygen. Where s is 0, the atom in A that bonds with the main chain becomes an ethereal oxygen and a second ethereal oxygen atom may be incorporated at any position excluding the position between the α- and β-carbons relative to that ethereal oxygen. Alkylene groups having more than 10 carbon atoms are undesirable because of a low solubility in alkaline developer.

$R^8$ is each independently hydrogen or a $C_1$-$C_6$ alkyl group. Preferred examples of the alkyl group include methyl, ethyl, propyl, isopropyl, butyl, pentyl, hexyl, and structural isomers of a carbon skeleton having branched or cyclic structure. Alkyl groups having more than 6 carbon atoms are undesirable because of a low solubility in alkaline developer.

The subscript "a" is an integer of 0 to 4, and "b" is a positive integer of 1 to 5. Preferably, a is an integer of 0 to 3 and b is an integer of 1 to 3 when t is 0. Also preferably, a is an integer of 0 to 4 and b is an integer of 1 to 5 when t is 1 or 2. The subscript t is an integer of 0 to 2. The structure represents a benzene skeleton when t=0, a naphthalene skeleton when t=1, and an anthracene skeleton when t=2.

Of the recurring units of formula (3), those recurring units wherein s is 0 and A is a single bond (meaning that the aromatic ring is directly bonded to the main chain of the polymer), that is, linker-free recurring units are units derived from monomers in which a 1-substituted or unsubstituted vinyl group is attached to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units wherein s is 1, that is, recurring units having an ester structure as the linker are units of carbonyl-substituted vinyl monomers as typified by (meth)acrylates.

Preferred examples of the units of formula (3) having a linker (—CO—O-A-) derived from (meth)acrylates are shown below.

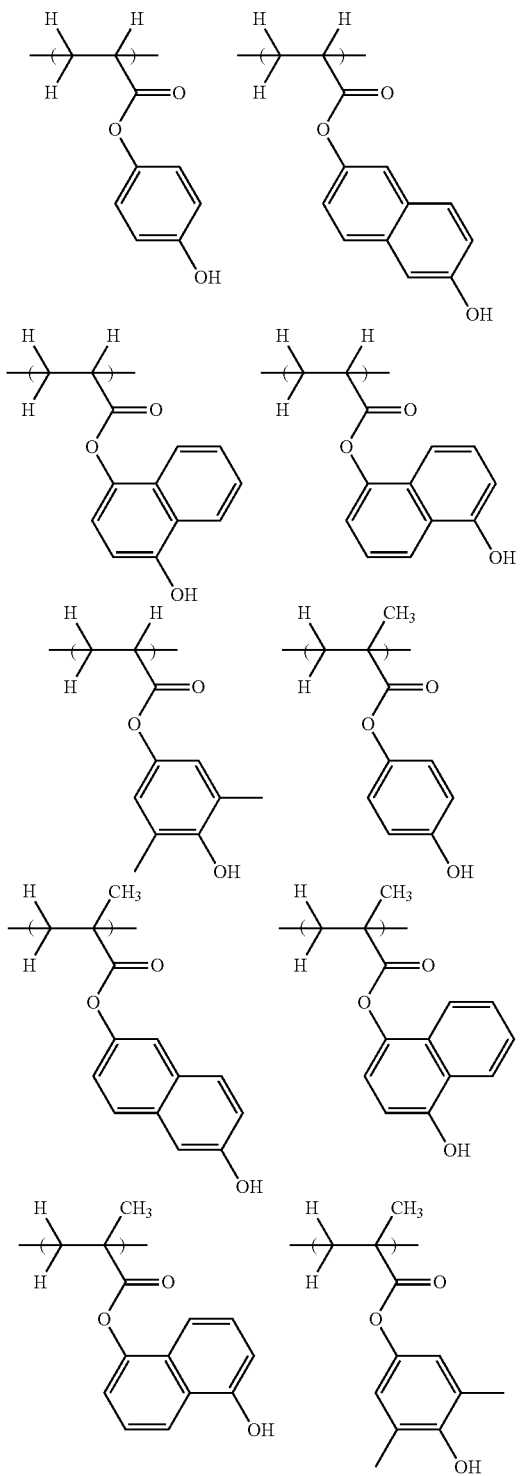

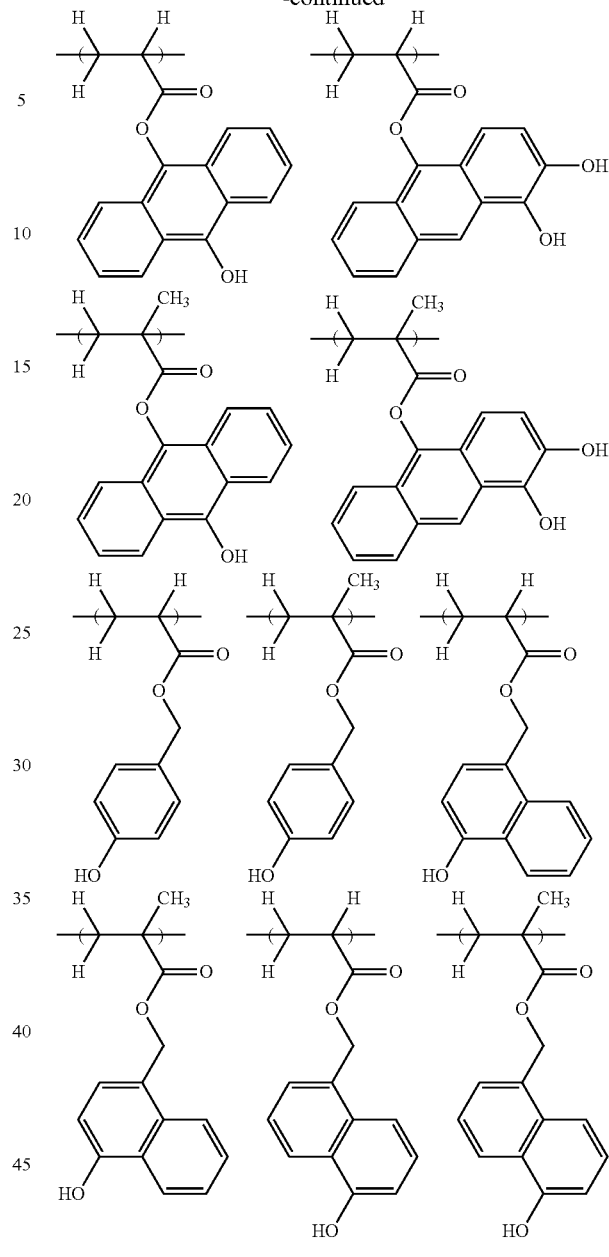

Preferred recurring units used for adjusting the solubility of the polymer in alkaline developer include units of the general formula (4).

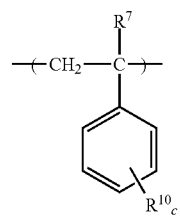

(4)

Herein $R^7$ is hydrogen or methyl, $R^{10}$ is hydrogen, halogen, an optionally halo-substituted $C_1$-$C_8$ alkyl or alkoxy group, an alicyclic group, an aromatic group, or an optionally halo-substituted $C_2$-$C_8$ alkylcarbonyloxy group, and c is an integer of 1 to 5.

Of groups represented by $R^{10}$, fluorine, chlorine and bromine are exemplary of halogen. The alkoxy group is preferably those of 1 to 6 carbon atoms, more preferably 1 to 4 carbon atoms, for example, methoxy and isopropoxy. The optionally substituted alkyl groups include straight, branched or cyclic alkyl groups such as methyl, ethyl, propyl, isopropyl, butyl, tert-butyl, pentyl, cyclopentyl, hexyl, cyclohexyl, and octyl, and substituted forms of the foregoing alkyl groups in which one or more hydrogen atoms are substituted by halogen or the like.

These units, when used as constituent units of a polymer, contribute to material design in that the aromatic ring provides etch resistance, the dissolution rate of the polymer is adjustable, and the crosslinking efficiency can be controlled by a choice of the substituent group $R^7$.

As the recurring unit capable of providing higher etch resistance, units having the general formula (5) and/or (6) are preferably used.

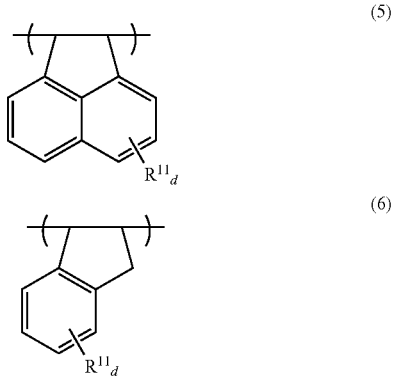

Herein d is an integer of 0 to 4, and $R^{11}$ is each independently hydrogen, hydroxyl, halogen, a $C_2$-$C_7$ alkylcarbonyloxy group, $C_1$-$C_6$ alkyl or alkoxy group, or halo-substituted $C_1$-$C_6$ alkyl or alkoxy group. When units of formulae (5) and (6) are used as constituent units of a polymer, there are obtained the advantages that the aromatic ring provides etch resistance as do units of formulae (3) and (4) and the addition of cyclic structure to the main chain enhances resistance to EB irradiation during etching or pattern inspection.

The base polymer used in most chemically amplified negative resist compositions including the inventive resist composition must be endowed with a function of providing solubility in alkaline developer, a function of imparting substrate adhesion, and a function to react with a crosslinkable functional group. The base polymer may be further endowed with a function of controlling solubility in alkaline developer and a function of providing higher etch resistance. Polymers comprising recurring units of different type each selected for an individual function combined to gain any of these functions may be used alone or in admixture of two or more as the base polymer.

As mentioned just above, a single polymer or a blend of different polymers may be used as the base polymer. When a single polymer is used, polymer design is made by selecting the type of recurring units for a particular function, and determining a ratio of recurring units of different type so that the resulting resist film may be given the desired resolution.

When a single polymer comprising recurring units of formula (1) is used as the base polymer, the polymer design is preferably such that the content of recurring units of formula (1) is 0.005 to 10 mol %, more preferably 0.01 to 7 mol %, and even more preferably 0.1 to 5 mol % based on the total recurring units of the polymer. If the content of recurring units of formula (1) is less than 0.005 mol %, the benefits of the invention become insignificant. A content of more than 10 mol % may result in a low sensitivity.

With respect to other recurring units, the type and amount thereof must be selected and determined in accordance with the desired properties. Where recurring units of formula (3) are used as the unit for imparting substrate adhesion and solubility in alkaline developer, the polymer design is preferably made such that the content of recurring units of formula (3) is at least 30 mol %, more preferably at least 40 mol % based on the total recurring units of the polymer in order to provide an alkaline solubility sufficient to eliminate residues upon development, although the content varies depending on the strength of polarity, the fat solubility of aromatic ring, and the presence or absence of alkyl substituent group. In some cases, recurring units of formula (3) may be all recurring units but the recurring units of formula (1). That is, recurring units of formula (3) may account for 99.995 mol % at maximum. The recurring units of formula (3) may be of one type or a mixture of two or more types.

If a pattern collapse occurs on account of a high dissolution rate of the base polymer in alkaline developer, the polymer may be improved in resolution by adding recurring units of formula (4). When used, the content of recurring units of formula (4) is preferably 5 to 40 mol %, more preferably 5 to 30 mol % based on the total recurring units of the polymer. A content of more than 40 mol % may lead to a risk of residues remaining after development. The recurring units of formula (4) may be of one type or a mixture of two or more types.

Also the recurring units of formulae (5) or (6) may be of one type or a mixture of two or more types. For the purpose of improving etch resistance, the recurring units of formula (5) or (6) are preferably incorporated in an amount of at least 5 mol % based on the total recurring units of the polymer. Where the functional group in recurring units (5) and (6) is hydroxyl, the content of recurring units (5) and (6) incorporated is added to the content of recurring units (3) so that the sum may fall in the above-defined range of recurring units (3). Where recurring units (5) and (6) have no functional group or the functional group is other than hydroxyl, the content of recurring units (5) and (6) incorporated is preferably up to 30 mol %. Where recurring units (5) and (6) have no functional group or the functional group is other than hydroxyl, a content of recurring units (5) and (6) in excess of 30 mol % may cause development defects While a polymer comprising recurring units selected from formulae (1) to (6) as the main constituent units is used as the base polymer, it may further comprise any commonly used, well-known recurring units as additional recurring units, typically in a content of up to 30 mol %. Suitable additional recurring units include (meth)acrylate units having an oxirane ring, commonly used as crosslinking units, and (meth)acrylate units having an adhesive group such as lactone structure (see Patent Document 4). The properties of the resist film may be finely adjusted by controlling the content of the additional recurring units although the additional recurring units may be omitted.

In another embodiment of the chemically amplified negative resist composition wherein a blend of two or more polymers is used as the base polymer, it may be either a blend of plural polymers comprising recurring units of formula (1) or a blend of a polymer comprising recurring units of formula (1) and a polymer free of recurring units of formula (1).

Where such a polymer blend is used, the content of recurring units of formula (1) relative to the overall recurring units of the base polymer is preferably in the same range as defined for the single polymer. However, prior to blending, the content of recurring units of formula (1) in a polymer relative to the overall recurring units of the polymer may vary over a very broad range. Specifically, the content of recurring units of formula (1) is preferably up to 70 mol %, more preferably up to 50 mol %. If the content of recurring units of formula (1) is more than 70 mol %, there may be a risk of pattern collapse or residues remaining after development even when the balance consists of recurring units having an alkali soluble function. With respect to the lower limit, the standard is 0.005 mol % which is the lower limit of the content of recurring units of formula (1) in the above-mentioned case of a single polymer. A polymer comprising at least 0.005 mol % of recurring units of formula (1) is necessary to achieve the benefits of the invention in an effective manner.

When a polymer comprising recurring units selected from the formulae (3) to (6) as the main constituent component other than the recurring unit of formula (1) is used in the polymer blend, a preferred combination of recurring units may be found from the above-defined range.

In the embodiment wherein a blend of a polymer comprising recurring units of formula (1) and another polymer free of recurring units of formula (1) is used as the base polymer, the other polymer free of recurring units of formula (1) may be any polymers which are used in well-known chemically amplified negative resist compositions and which are alkali soluble, but turn alkali insoluble upon exposure to high-energy radiation in the presence of an acid generator and a crosslinker. Since the other polymer should not undergo phase separation when mixed with the polymer comprising recurring unit of formula (1), a polymer comprising recurring units of analogous fundamental structure, but free of recurring units of formula (1) is preferably selected. For example, where a polymer comprising recurring units of formula (1) in combination with recurring units selected from formulae (2) to (6) is used as the polymer comprising recurring units of formula (1), the other polymer free of recurring units of formula (1) may preferably comprise constituent units selected from formulae (3) to (6). A polymer comprising recurring units mostly derived from an aromatic structure-free (meth)acrylic acid monomer in combination with recurring units mostly derived from a styrene monomer has a possibility of phase separation leading to a substantial roughness after development.

Shown below are exemplary combinations of recurring units that constitute another polymer free of recurring units of formula (1) which is preferred for blending with a polymer comprising recurring units (1) to (4) and optionally recurring units (5) and (6) as constituent units, that is, a polymer having carboxylic acid on a side chain.

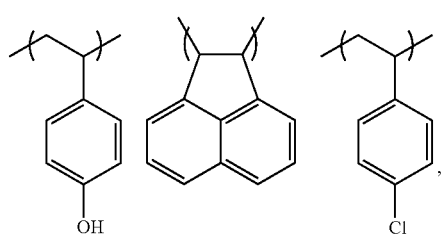

-continued

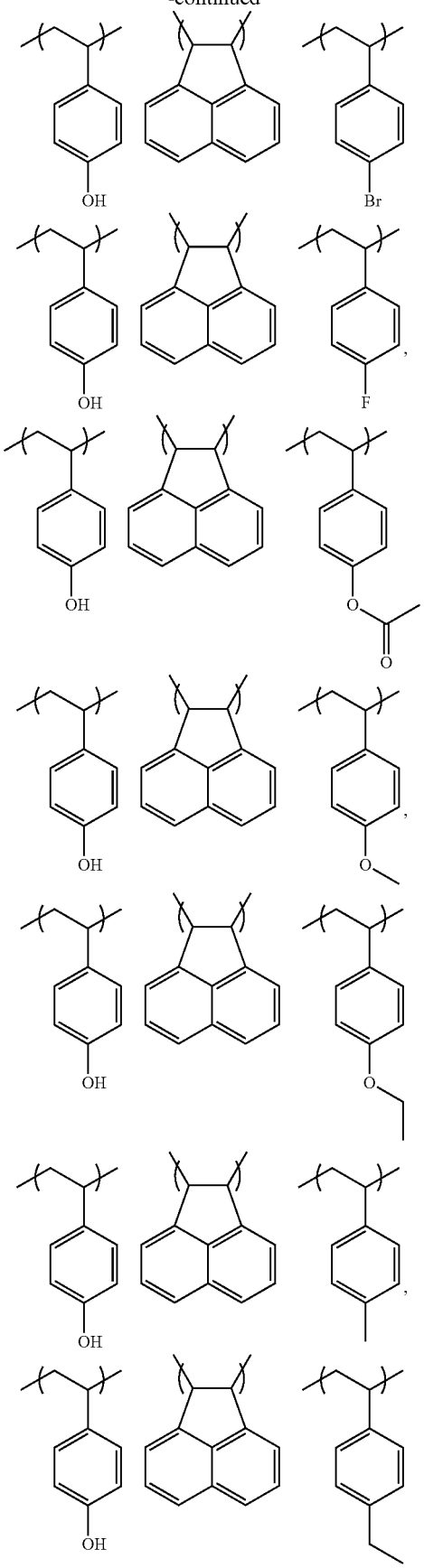

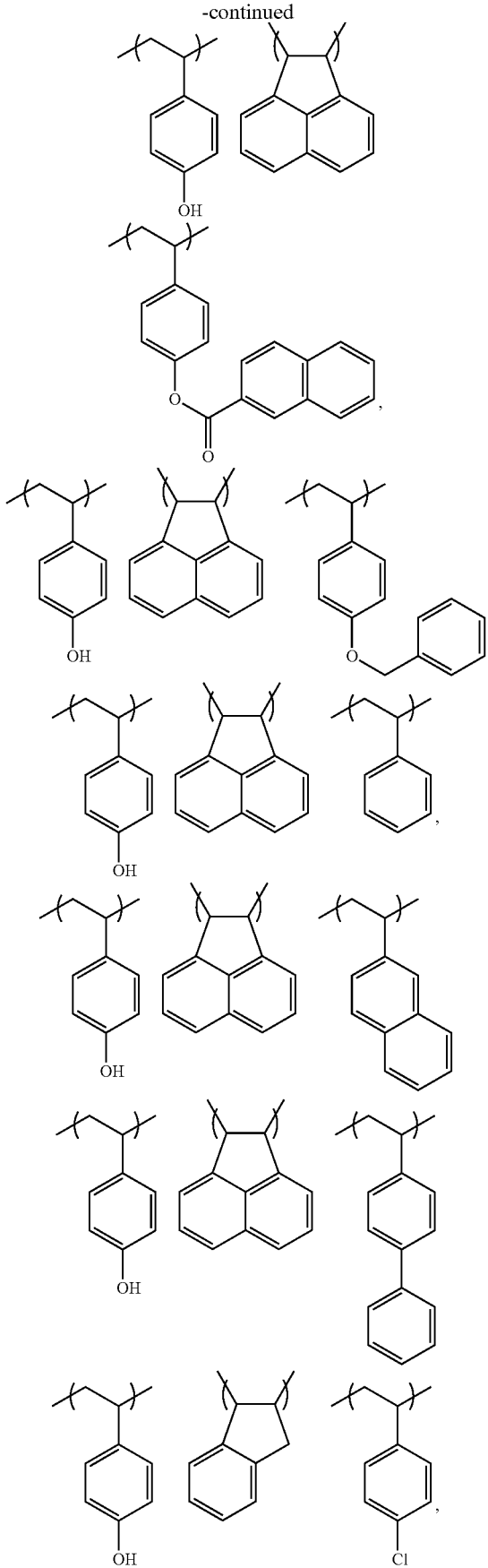
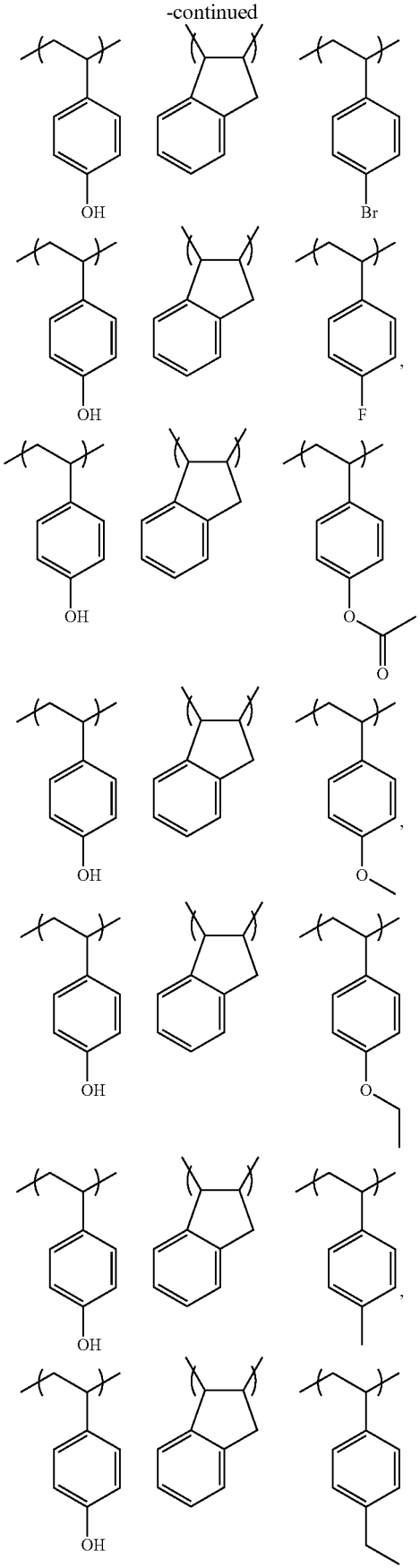

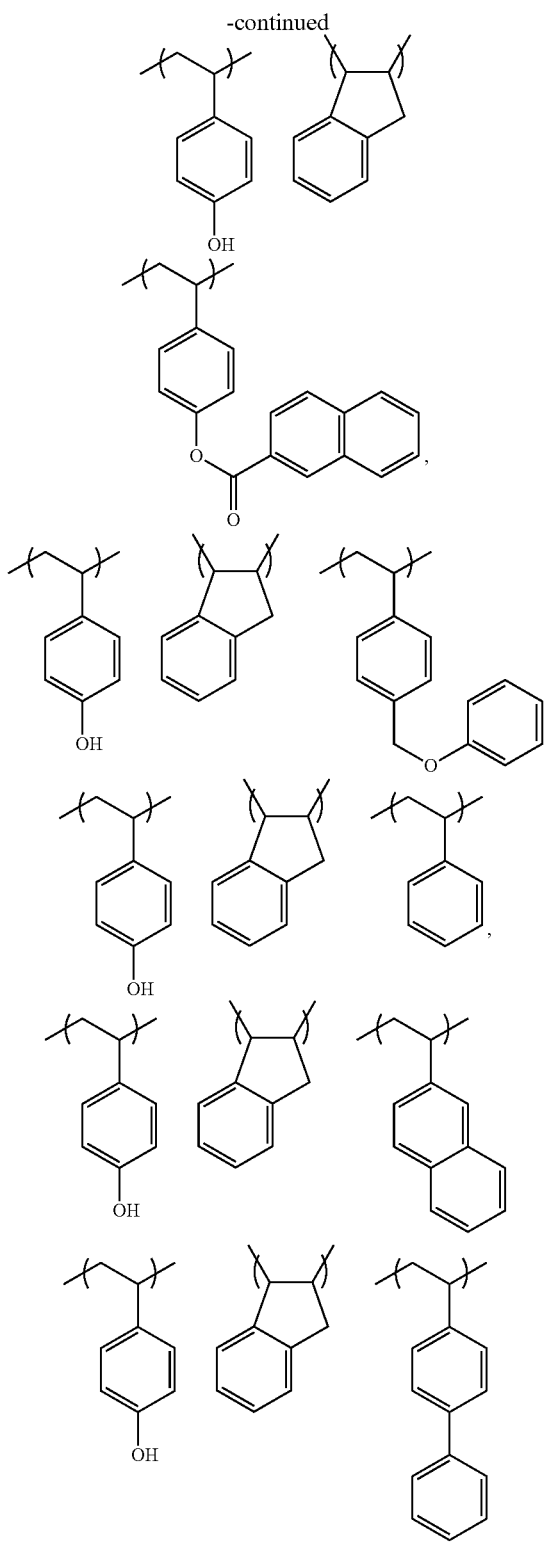

It is noted that an optimum constitutional ratio of recurring units in a polymer free of recurring units of formula (1) may be found within the same range of the preferred constitutional ratio of the polymer comprising recurring units of formula (1).

When a blend of a polymer comprising recurring units of formula (1) and a polymer free of recurring units of formula (1) is used as the base polymer, the polymer comprising recurring units of formula (1) is preferably present in an amount of at least 0.1% by weight, more preferably at least 0.5% by weight of the overall base polymer. Less than 0.1% of the polymer comprising recurring units of formula (1) may fail to achieve the edge roughness reducing effect.

The polymer used in the resist composition may be prepared by effecting copolymerization of monomers by any well-known techniques with an optional combination of protection and deprotection reactions. The copolymerization reaction is preferably radical polymerization, but not limited thereto. With respect to the polymerization reaction, reference should be made to Patent Documents 2 to 5.

The polymer used as the base polymer in the resist composition typically has a weight average molecular weight (Mw) of 1,000 to 50,000, and preferably 1,000 to 20,000, as measured by gel permeation chromatography (GPC) using polystyrene standards. A polymer with a Mw of less than 1,000 may lead to a pattern having a rounded top, reduced resolution, and degraded LER as is well known in the art. If Mw is higher than the necessity, the pattern tends to have increased LER, depending on the pattern size to be resolved. The Mw is preferably controlled to 20,000 or less particularly when a pattern having a line width of up to 100 nm is formed.

The polymer preferably has a narrow dispersity as demonstrated by a molecular weight distribution Mw/Mn in the range of 1.0 to 3.0, more preferably 1.0 to 2.5. A broader dispersity may cause drawbacks to the pattern such as foreign matter after development and degraded profile.

A crosslinker may be added to the chemically amplified negative resist composition of the invention. As briefly indicated above, the crosslinker may be integrated with the polymer by suitable means such as incorporating oxirane ring-bearing recurring units into the polymer. In a common practice, however, the crosslinker is separately added.

While an acid which is generated by a PAG acts as a catalyst, the crosslinker reacts with the polymer to form crosslinks within the polymer and between polymer molecules for thereby rendering the polymer alkali insoluble. It is typically a compound having a plurality of functional groups capable of electrophilic reaction with aromatic rings or hydroxyl groups in constituent units of the polymer to form bonds therewith. A number of compounds are well known as the crosslinker, as described in Patent Documents 1 to 3.

As the crosslinker used herein, any well-known crosslinkers may be applicable. Suitable crosslinkers include alkoxymethylglycolurils and alkoxymethylmelamines. Exemplary of the alkoxymethylglycolurils are tetramethoxymethylglycoluril, 1,3-bismethoxymethyl-4,5-bis-methoxyethyleneurea, and bismethoxymethylurea. Exemplary of the alkoxymethylmelamines are hexamethoxymethylmelamine and hexaethoxymethylmelamine.

In the negative resist composition, the crosslinker is preferably added in an amount of 2 to 40 parts, more preferably 5 to 20 parts by weight per 100 parts by weight of the base polymer. The crosslinker may be used alone or in admixture of two or more.

Component (B) is an acid generator. It is a compound which is decomposed to generate an acid upon exposure to high-energy radiation. A number of acid generators are known for use in chemically amplified resist compositions, as described in Patent Documents 1 to 4, for example. Generally any of these acid generators may be used. For use in the EB and EUV lithography, sulfonium base acid generators are useful, and a number of suitable compounds are also known. Further, the sulfonium base acid generator may take the form of a polymer having the acid generator incorporated in a side chain from its recurring unit as described in Patent Document 5.
Preferred examples of the acid generator are illustrated below, but not limited thereto.
Shown below are examples of the acid generator as component (B) which is not incorporated in a polymer.
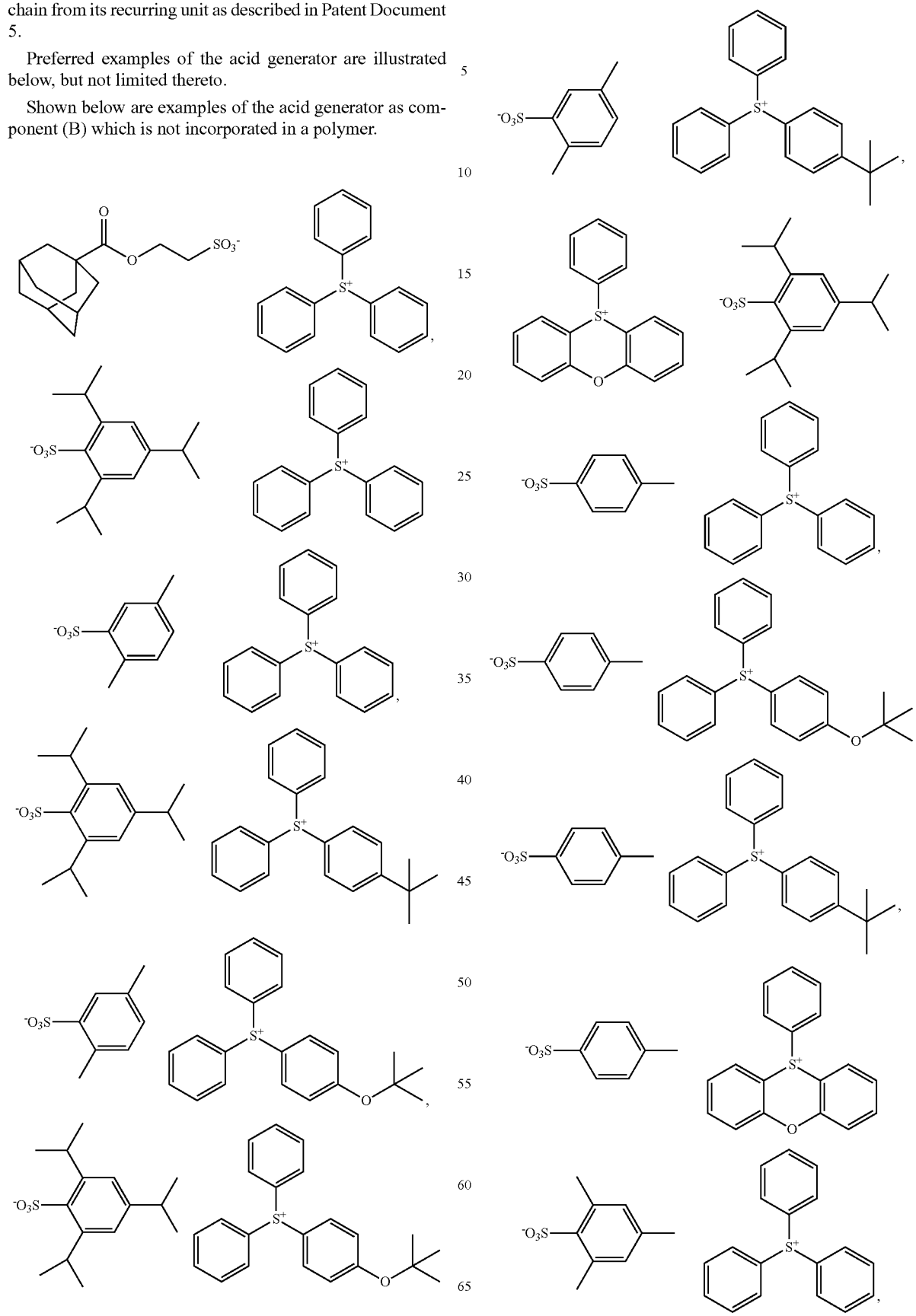

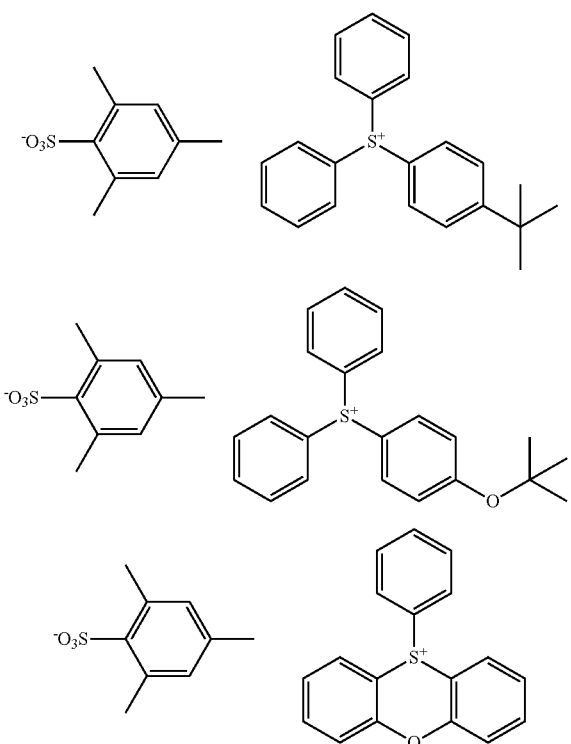
Shown below are examples of the polymer having the acid generator as component (B) incorporated therein.
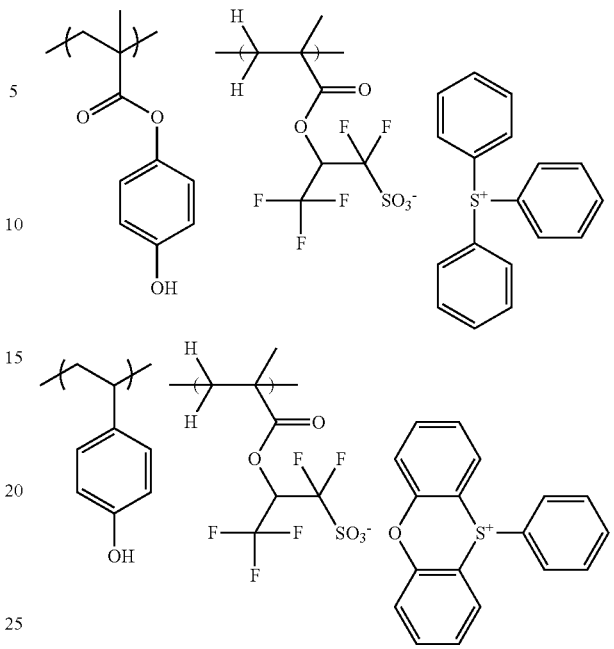
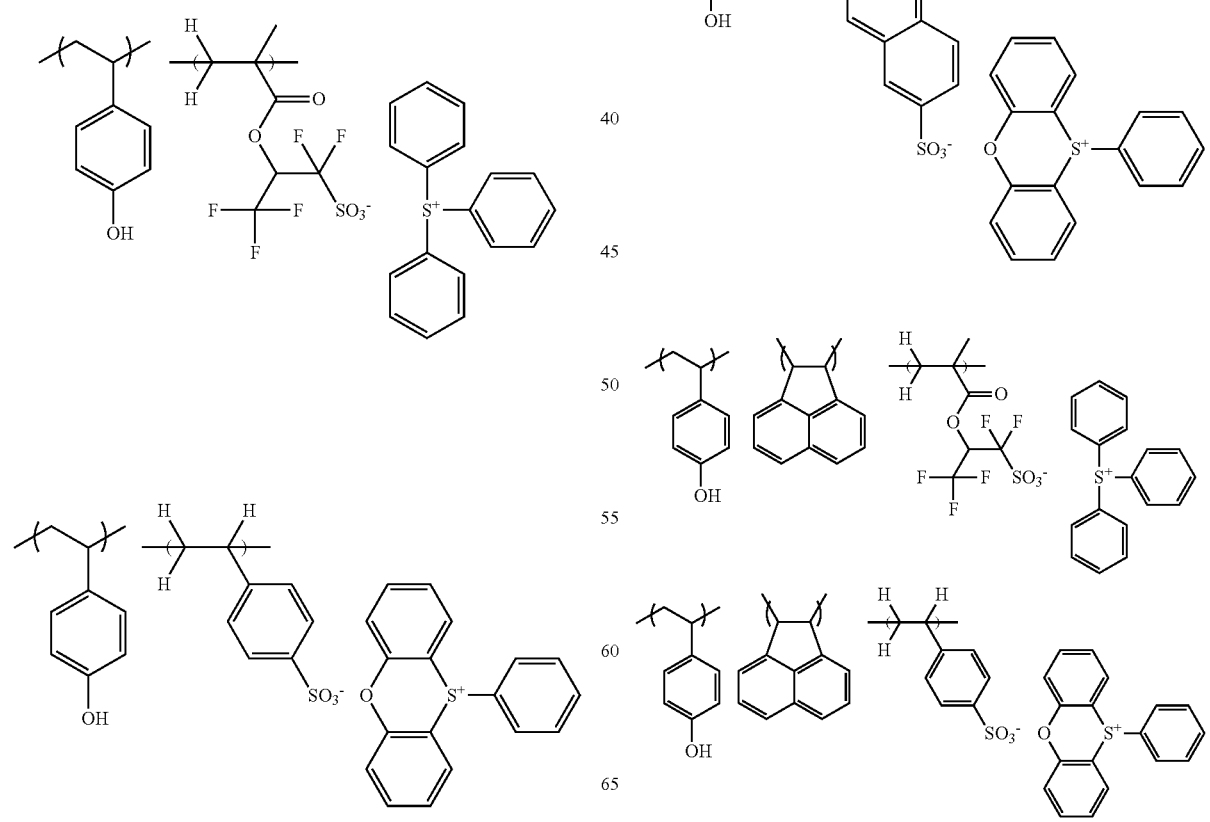

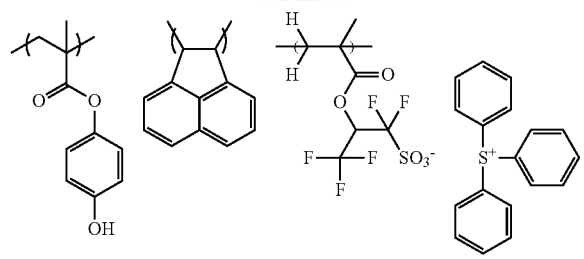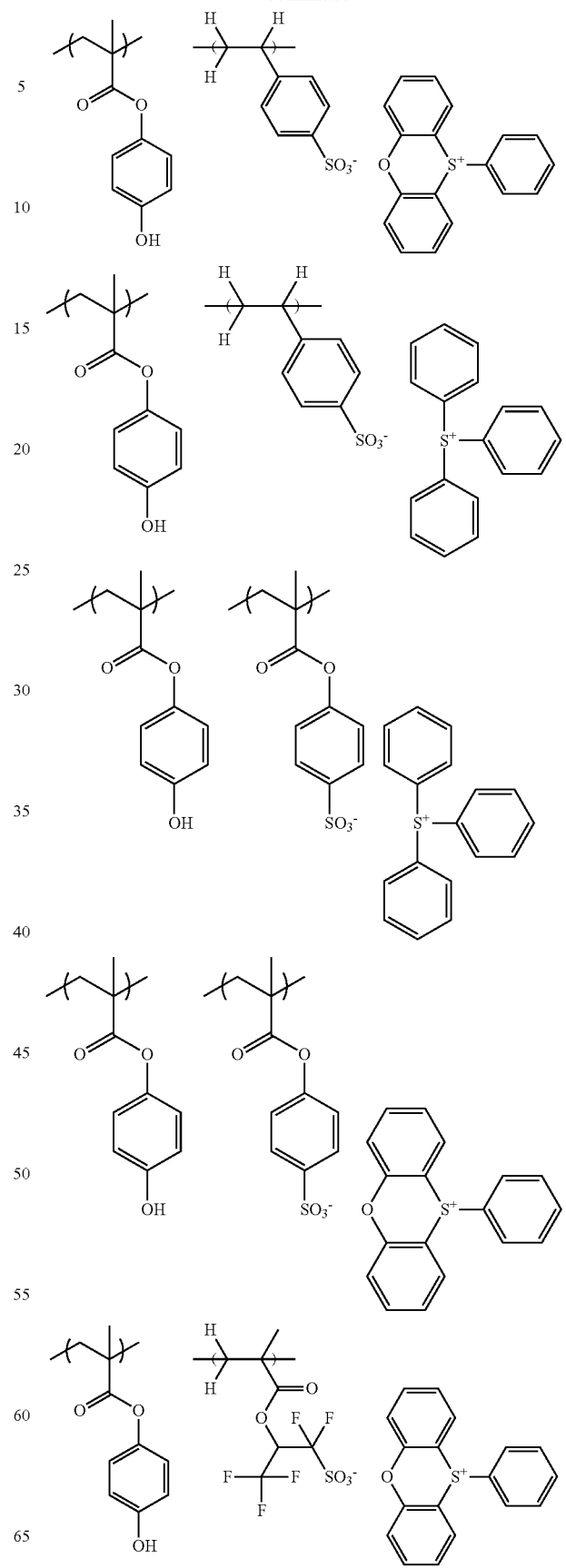

-continued

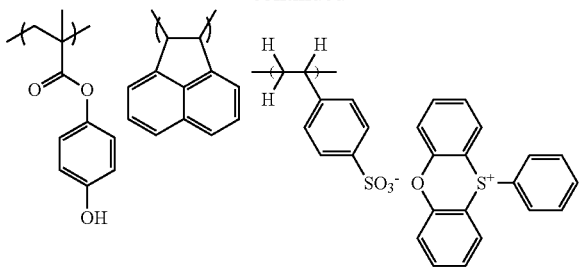

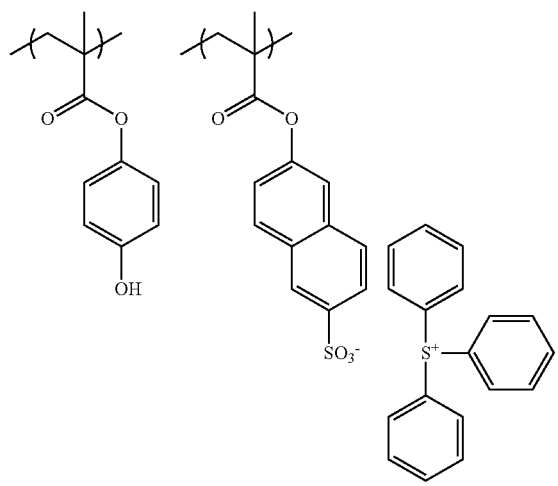

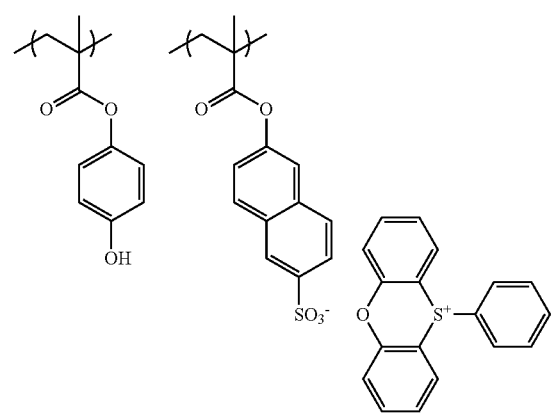

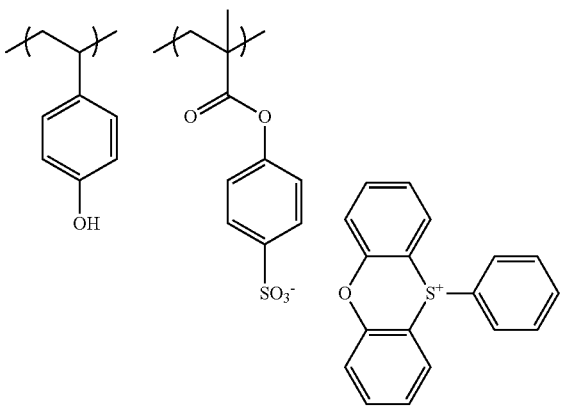

Although the amount of the PAG added to the negative resist composition is not particularly limited, any of well-known acid generators may be used in a suitable amount as described, for example, in Patent Documents 1 to 5. The PAG is preferably added in an amount of 0.1 to 15 parts, more preferably 2.0 to 12.0 parts by weight per 100 parts by weight of the base polymer in the resist composition. An excess of the PAG added may give rise to such problems as degraded resolution and foreign particles upon development and resist stripping. The PAGs may be used alone or in admixture of two or more.

The resist composition may be obtained by dissolving the foregoing components in a solvent to be described later and optionally adding other additives such as a basic compound having a molecular weight of up to 1,000 and a surfactant.

In the resist composition of the invention, a basic compound need not be positively added because the polymer comprises recurring units of formula (1) which apparently act as a base as described above. Nevertheless, it is acceptable to add a basic compound having a molecular weight of up to 1,000 for fine adjustment of a pattern profile such as overhanging at the top or footing near the substrate and fine adjustment of sensitivity. When used, the basic compound is preferably added in an amount of 0.01 to 2 parts, more preferably 0.05 to 1 part by weight per 100 parts by weight of the base polymer.

With respect to the basic compound which is added separately from the polymer, a number of suitable compounds are known, for example, from Patent Documents 1 to 5. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, carbamate derivatives, and ammonium salts. Numerous examples of these basic compounds are described in Patent Document 2. Generally any of these basic compounds may be used. Two or more may be selected from these basic compounds and used in admixture.

Examples of the basic compound which is preferably compounded herein include tris(2-(methoxymethoxy)ethyl) amine N-oxide, morpholine derivatives, and imidazole derivatives.

When a resist pattern is formed on a substrate, typically a substrate having a surface layer of chromium compound, there may arise a phenomenon that the pattern is cut inward at the substrate interface during pattern formation, known as a undercut profile. Although the resist composition of the invention itself has an ability to mitigate this phenomenon, it is recommended to add an amine compound or amine oxide compound having a carboxyl group, but free of hydrogen in covalent bond with nitrogen serving as basic center (exclusive of those amine and amine oxide compounds whose nitrogen atom is contained in the cyclic structure of aromatic ring) because the amine is effective for improving the pattern profile.

Preferred examples of the amine or amine oxide compound having a carboxyl group, but free of hydrogen in covalent bond with nitrogen serving as basic center include compounds of the general formulae (7) to (9), but are not limited thereto.

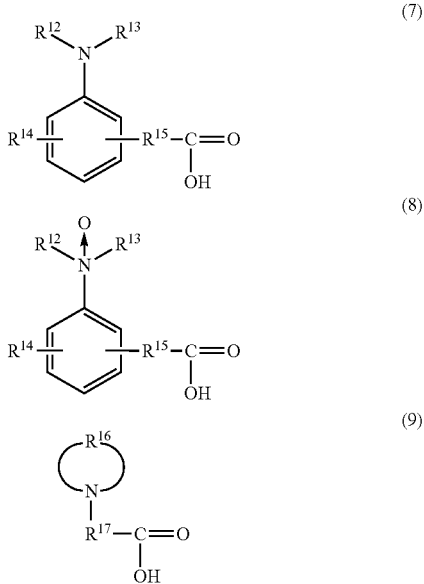

Herein $R^{12}$ and $R^{13}$ are each independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, or $C_1$-$C_{10}$ alkylthioalkyl group. $R^{12}$ and $R^{13}$ may bond together to form a ring with the nitrogen atom to which they are attached. $R^{14}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, $C_1$-$C_{10}$ alkylthioalkyl group, or halogen. $R^{15}$ is a single bond, a straight, branched or cyclic $C_1$-$C_{20}$ alkylene group, or $C_6$-$C_{20}$ arylene group. $R^{16}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{17}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_2$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and isomers of their alkyl moiety. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_1$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (7) include, but are not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalenic acid, 3-diethylamino-2-naphthalenic acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Preferred examples of the amine oxide compound of formula (8) include oxidized forms of exemplary amine compounds of formula (7), but are not limited thereto.

Preferred examples of the amine compound of formula (9) include, but are not limited thereto, 1-piperidinepropionic acid, 1-piperidinebutyric acid, 1-piperidinemalic acid, 1-piperidinepyruvic acid, and 1-piperidinelactic acid.

Some of the compounds having an amine oxide structure represented by formula (8) are existing and some are novel compounds. They may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. These methods are described below in detail.

One exemplary method for preparing a nitrogen-containing alcohol compound through esterifying reaction is shown below. This method is applicable to the synthesis of a compound of formula (9).

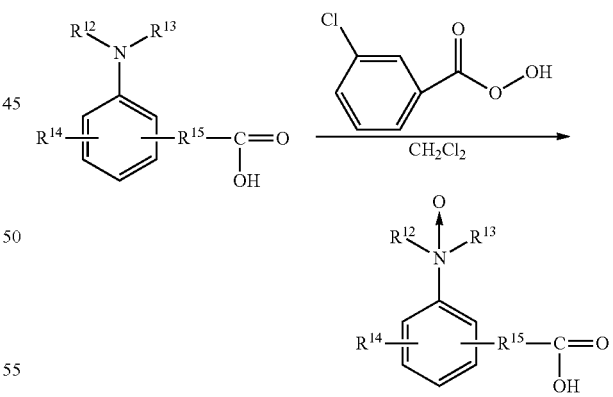

Herein $R^{12}$ to $R^{15}$ are as defined above.

This reaction is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization. Reference is made to Patent Document 6.

To the resist composition, any of surfactants commonly used for improving coating characteristics may be added. A number of surfactants are well known and described in Patent Documents 1 to 6 and any suitable one may be selected therefrom.

In the resist composition, the surfactant is preferably formulated in an amount of up to 2 parts, and more preferably up to 1 part by weight, per 100 parts by weight of the overall polymer. When used, the surfactant is preferably added in an amount of at least 0.01 part by weight.

An organic solvent may be used in the preparation of the resist composition. It may be any of organic solvents in which the polymer, acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the negative resist composition, the organic solvent is preferably used in an amount of 1,000 to 10,000 parts by weight, more preferably 2,000 to 9,700 parts by weight per 100 parts by weight of the overall polymer. When adjusted to such a concentration, the resist composition is applicable by a spin coating technique to form a resist film having a thickness of 10 to 200 nm and an improved flatness in a consistent manner.

Process

Pattern formation using the resist composition of the invention may be performed by well-known lithography processes. The process generally involves coating, optional prebaking, exposure to high-energy radiation, optional PEB, and development with alkaline developer. The resist composition is first applied onto a substrate for IC fabrication (e.g., Si, $SiO_2$, SiN, SiON, TiN, WSi, BPSG, SOG, organic antireflective coating or the like) or a substrate for mask circuit fabrication (e.g., Cr, CrO, CrON, MoSi or the like) by a suitable coating technique such as spin coating. The coating is prebaked on a hot plate at a temperature of 60 to 150° C. for 1 to 10 minutes, preferably 80 to 140° C. for 1 to 5 minutes to form a resist film of 0.05 to 2.0 μm thick.

Then the resist film is exposed to high-energy radiation, typically DUV, excimer laser or x-ray through a mask having a desired pattern. Alternatively, a pattern is written on the resist film directly with EB. The exposure dose is preferably 1 to 200 mJ/cm$^2$, more preferably 10 to 100 mJ/cm$^2$. The exposure may be performed by conventional lithography whereas the immersion lithography of holding a liquid between the mask and the resist film may be employed if desired. In this case, a protective film which is insoluble in water may be applied on the resist film. The resist film is then baked (PEB) on a hot plate at 60 to 150° C. for 1 to 5 minutes, preferably 80 to 140° C. for 1 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

It is known that when a chemically amplified negative resist film is formed on a certain substrate and processed to form a resist pattern, the pattern tends to be undercut. The tendency is outstanding particularly when the substrate has a layer of nitrogen-containing material such as SiN, SiON, MoSiN, MoSiON or TiN on its surface. More serious undercutting occurs when the substrate has a layer of chromium based material such as Cr, CrO, CrON or a material containing chromium and carbon. Unexpectedly, the resist film of the chemically amplified negative resist composition according to the invention overcomes the undercut problem during pattern formation.

One advantage of the resist film of the resist composition using the base polymer further comprising recurring units selected from formulae (2) to (5) is high etch resistance. Also the resist composition is effective when it is required that the pattern experience a minimal change of line width even when the duration between exposure and PEB is prolonged. The resist composition is effectively applicable to a processable substrate, specifically a substrate having a surface layer of material to which a resist film is less adherent and which is likely to invite pattern stripping or pattern collapse, and particularly a substrate having sputter deposited thereon a surface layer material susceptible to pattern collapse, typically metallic chromium or a chromium compound containing at least one light element selected from oxygen, nitrogen and carbon.

EXAMPLE

Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards, from which a dispersity (Mw/Mn) is computed. Me stands for methyl. The compositional ratio of a copolymer is on a molar basis.

Monomer Synthesis Example 1

Preparation of triphenylsulfonium 2,2-difluoro-3-methacryloyloxypentanoate

A 1-L glass flask equipped with a dropping funnel was charged with 108 g (0.486 mol) of 1-hydroxycarbonyl-1,1-difluoro-2-butyl methacrylate and 108 g of chloroform, which were stirred and cooled at 0° C. Then 224 g (0.560 mol/1.15 equivalent) of a 10 wt % sodium hydroxide aqueous solution was added dropwise to the solution, which was stirred at room temperature for 1 hour. Then 169 g (0.492 mol/1.01 equivalent) of triphenylsulfonium bromide in 432 g of chloroform was added to the solution, which was stirred at room temperature for 1 hour. After the completion of reaction was confirmed by $^1$H-NMR spectroscopy, an organic layer was separated from the reaction liquid and washed 3 times with 300 g of water. The organic layer was concentrated in vacuum, obtaining 238 g (yield 81%, purity 80%) of triphenylsulfonium 2,2-difluoro-3-methacryloyloxy-pentanoate, designated Monomer Z-1, having the following structure.

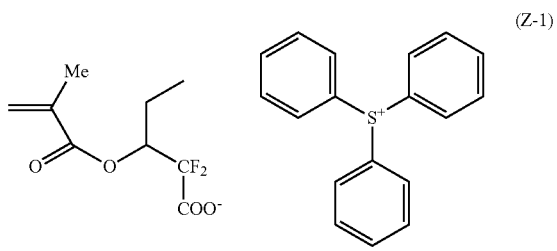

Identification of triphenylsulfonium
2,2-difluoro-3-methacryloyloxypentanoate $^1$H-NMR (measurement solvent: heavy chloroform, reference: tetramethylsilane); δ=7.67 (m, 15H; Ph group), 6.10 (s, 1H; =CH$_2$), 5.53 (m, 1H; CH—O), 5.47 (s, 1H; =CH$_2$), 1.86 (s, 3H; CH$_3$—C), 1.84 (m, 1H; CH$_2$ of CH—CH$_2$CH$_3$), 1.71 (m, 1H; CH$_2$ of CH—CH$_2$CH$_3$), 0.83 (t, J=7.6 Hz, 3H; CH$_3$ of CH—CH$_2$CH$_3$)

$^{19}$F-NMR (measurement solvent: heavy chloroform, reference: trichlorofluoromethane); δ=−111.52 (d, J=244 Hz, 1F), −118.07 (d, J=244 Hz, 1F)

Polymer Synthesis Example 1

In a 200-mL dropping funnel under nitrogen blanket, a solution was prepared by dissolving 33.2 g of 4-hydroquinone monomethacrylate, 4.7 g of acenaphthylene, 10.6 g of 4-methylstyrene, 1.5 g of Monomer Z-1, and 5.7 g of dimethyl 2,2'-azobis(2-methylpropionate) (V601, Wako Pure Chemical Industries, Ltd.) in 70 g of methyl ethyl ketone (MEK) as a solvent. A 300-mL polymerization flask was purged with nitrogen, charged with 50 g of MEK, and heated at 80° C., after which the solution was added dropwise to the flask over 4 hours. After the completion of dropwise addition, stirring was continued for 16 hours to effect polymerization while maintaining the temperature of 80° C. The polymerization solution was then cooled down to room temperature and added dropwise to 1,000 g of hexane for precipitation. The copolymer precipitate was collected by filtration and washed twice with 200 g of hexane. The mass collected by filtration was dissolved in 120 g of MEK. The MEK solution was passed through a nylon filter with a pore size of 0.02 μm and added dropwise to 1,000 g of hexane for precipitation. The copolymer precipitate was collected by filtration, washed twice with 200 g of hexane, and dried, yielding 40 g of a white copolymer, designated Polymer 1, having Mw=4,300 and Mw/Mn=1.64.

Polymer Synthesis Example 2

In a 500-mL dropping funnel under nitrogen blanket, a solution was prepared by dissolving 76.0 g of 4-(1-ethoxyethoxy)styrene, 8.6 g of acenaphthylene, 12.7 g of 4-methylstyrene, 2.7 g of Monomer Z-1, and 10.4 g of dimethyl 2,2'-azobis(2-methylpropionate) (V601, Wako Pure Chemical Industries, Ltd.) in 112 g of propylene glycol monomethyl ether (PGME) as a solvent. A 500-mL polymerization flask was purged with nitrogen, charged with 75 g of PGME, and heated at 80° C., after which the solution was added dropwise to the flask over 4 hours. After the completion of dropwise addition, stirring was continued for 20 hours to effect polymerization while maintaining the temperature of 80° C. The polymerization solution was then cooled down to room temperature. To the solution were added 25 g of methanol and 1.25 g of oxalic acid dihydrate. The mixture was stirred for 3 hours at 50° C. The reaction solution was added dropwise to a mixture of 2,000 g of water and 50 g of methanol for precipitation. The copolymer precipitate was collected by filtration, washed twice with a mixture of 500 g of water and 10 g of methanol, and dried, yielding 65.0 g of a white hydroxystyrene copolymer, designated Polymer 3, having Mw=4,940 and Mw/Mn=1.63.

Polymer Synthesis Examples 3 to 20

Resins (Polymers) shown in Table 1 were synthesized by the same procedure as Polymer Synthesis Example 1 or 2 except that the type and amount of monomers were changed. The units 1 to 4 in Table 1 have the structure shown in Table 2. In Table 1, a ratio of each unit incorporated is on a molar basis.

TABLE 1

| Resin | Unit 1 (ratio) | Unit 2 (ratio) | Unit 3 (ratio) | Unit 4 (ratio) |
|---|---|---|---|---|
| Polymer 1 | A-1 (0.60) | B-3 (0.29) | C-2 (0.10) | Z-1 (0.01) |
| Polymer 2 | A-1 (0.65) | B-1 (0.24) | C-2 (0.10) | Z-1 (0.01) |
| Polymer 3 | A-2 (0.70) | B-3 (0.19) | C-2 (0.10) | Z-1 (0.01) |
| Polymer 4 | A-2 (0.70) | B-3 (0.19) | C-1 (0.10) | Z-1 (0.01) |
| Polymer 5 | A-2 (0.73) | B-1 (0.16) | C-2 (0.10) | Z-1 (0.01) |
| Polymer 6 | A-2 (0.67) | B-2 (0.22) | C-2 (0.10) | Z-1 (0.01) |
| Polymer 7 | A-2 (0.71) | B-4 (0.18) | C-2 (0.10) | Z-1 (0.01) |
| Polymer 8 | A-3 (0.75) | B-3 (0.14) | C-2 (0.10) | Z-1 (0.01) |
| Polymer 9 | A-1 (0.58) | B-3 (0.27) | C-2 (0.10) | Z-1 (0.05) |
| Polymer 10 | A-2 (0.68) | B-3 (0.17) | C-2 (0.10) | Z-1 (0.05) |
| Polymer 11 | A-1 (0.60) | B-1 (0.20) | C-2 (0.10) | Z-1 (0.10) |
| Polymer 12 | A-2 (0.68) | B-1 (0.12) | C-2 (0.10) | Z-1 (0.10) |
| Polymer 13 | A-2 (0.65) | B-2 (0.15) | C-2 (0.10) | Z-1 (0.10) |
| Polymer 14 | A-2 (0.67) | B-3 (0.13) | C-2 (0.10) | Z-1 (0.10) |
| Polymer 15 | A-1 (0.55) | B-2 (0.25) | C-2 (0.10) | Z-1 (0.10) |
| Polymer 16 | A-2 (0.68) | B-4 (0.12) | C-2 (0.10) | Z-1 (0.10) |
| Polymer 17 | A-1 (0.80) | Z-1 (0.20) | — | — |
| Polymer 18 | A-2 (0.80) | Z-1 (0.20) | — | — |
| Polymer 19 | A-1 (0.60) | Z-1 (0.40) | — | — |
| Polymer 20 | A-2 (0.60) | Z-1 (0.40) | — | — |

TABLE 2

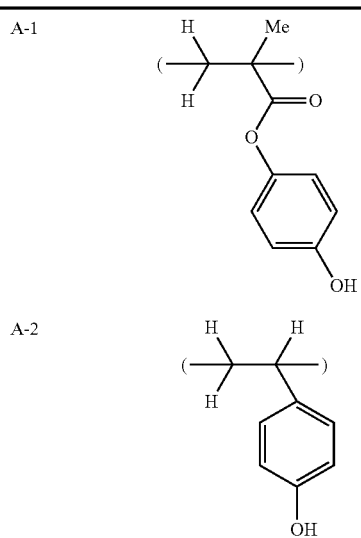

TABLE 2-continued

| | |
|---|---|
| A-3 | 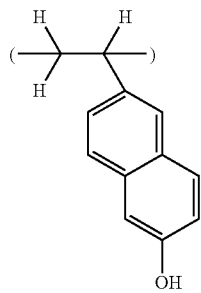 |
| B-1 | 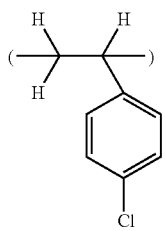 |
| B-2 | 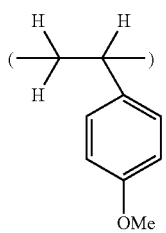 |
| B-3 | 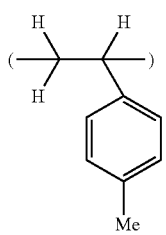 |
| B-4 | 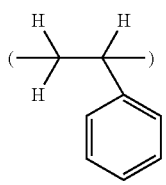 |
| C-1 | 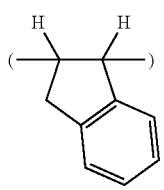 |
| C-2 | 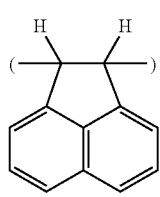 |

Examples & Comparative Examples

Preparation of Negative Resist Compositions

Resist compositions were prepared by using the synthesized polymers (Polymers 1 to 20) and other polymers (Polymers K and M as identified below), and dissolving the polymers, an acid generator (PAG-A or B), and a basic compound (Base-1 or 2) in an organic solvent mixture in accordance with the recipe shown in Tables 3 and 4. These compositions were each filtered through a nylon or UPE filter having a pore size of 0.02 μm, thereby giving negative resist composition solutions.

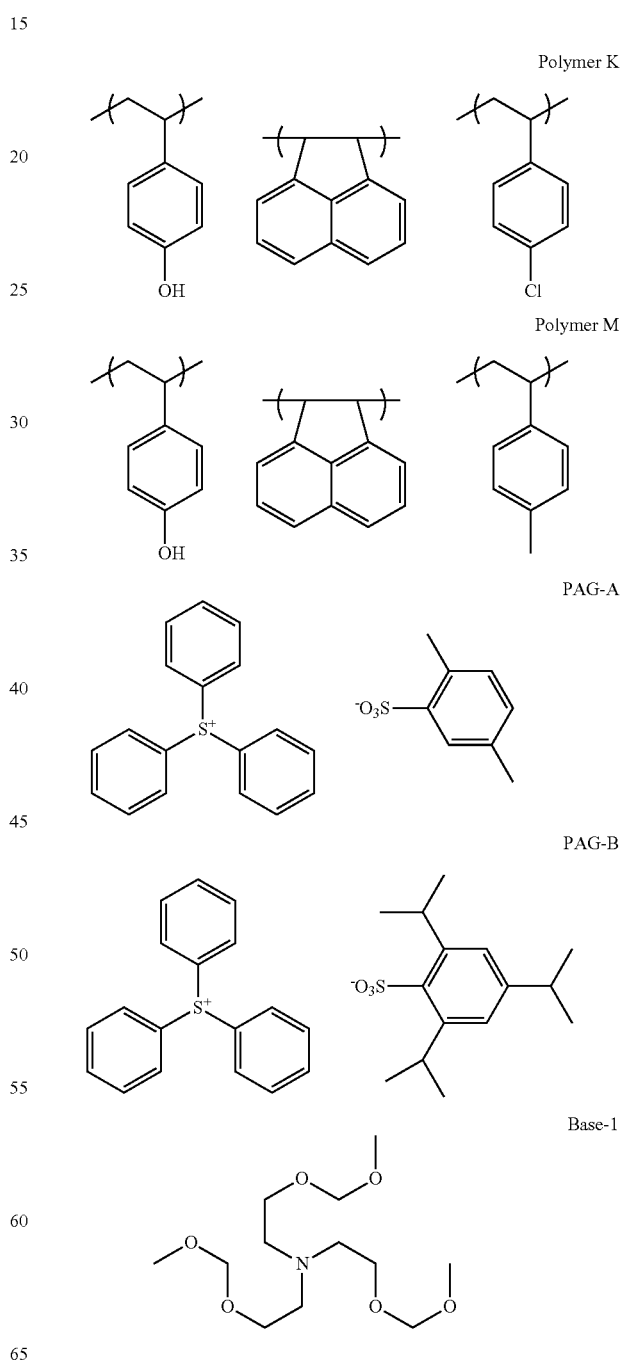

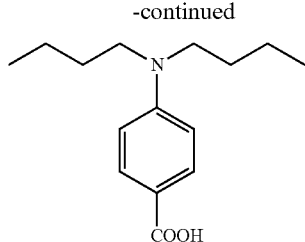

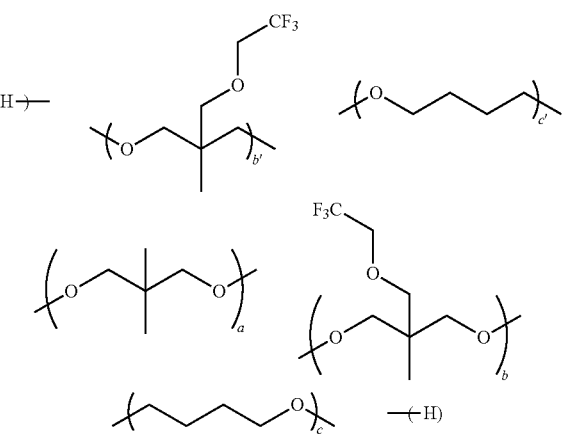

$a : (b + b') : (c + c') = 1 : 4\text{-}7 : 0.01\text{-}1$ (molar ratio)
Mw = 1,500

The organic solvents in Tables 3 and 4 were propylene glycol monomethyl ether acetate (PGMEA) and ethyl lactate (EL). Each composition further contained 8.154 parts by weight of an additive, tetramethoxymethyl glycoluril (TMGU) and 0.075 part by weight of a surfactant per 100 parts by weight of the polymer. The surfactant is 3-methyl-3-(2,2,2-trifluoroethoxymethyl)oxetane/tetrahydrofuran/2,2-dimethyl-1,3-propane diol copolymer having the following structural formula, commercially available from Omnova Solutions, Inc.

TABLE 3

| | Resin (pbw) | Acid generator (pbw) | Additive 1 (pbw) | Additive 2 (pbw) | Solvent 1 (pbw) | Solvent 2 (pbw) |
|---|---|---|---|---|---|---|
| Example 1 | Polymer 1 (80) | PAG-A(8) PAG-B(2) | — | TMGU (8.154) | PGMEA (1,109) | EL (2,587) |
| Example 2 | Polymer 2 (80) | PAG-A(8) PAG-B(2) | — | TMGU (8.154) | PGMEA (1,109) | EL (2,587) |
| Example 3 | Polymer 3 (80) | PAG-A(8) PAG-B(2) | — | TMGU (8.154) | PGMEA (1,109) | EL (2,587) |
| Example 4 | Polymer 3 (80) | PAG-A(8) PAG-B(2) | Base-2 (0.1) | TMGU (8.154) | PGMEA (1,109) | EL (2,587) |
| Example 5 | Polymer 3 (80) | PAG-A(8) PAG-B(2) | Base-1 (0.2) Base-2 (0.05) | TMGU (8.154) | PGMEA (1,109) | EL (2,587) |
| Example 6 | Polymer 4 (80) | PAG-A(8) PAG-B(2) | — | TMGU (8.154) | PGMEA (1,109) | EL (2,587) |
| Example 7 | Polymer 5 (80) | PAG-A(8) PAG-B(2) | — | TMGU (8.154) | PGMEA (1,109) | EL (2,587) |
| Example 8 | Polymer 6 (80) | PAG-A(8) PAG-B(2) | — | TMGU (8.154) | PGMEA (1,109) | EL (2,587) |
| Example 9 | Polymer 7 (80) | PAG-A(8) PAG-B(2) | — | TMGU (8.154) | PGMEA (1,109) | EL (2,587) |
| Example 10 | Polymer 8 (80) | PAG-A(8) PAG-B(2) | — | TMGU (8.154) | PGMEA (1,109) | EL (2,587) |
| Example 11 | Polymer K (80) | PAG-A(8) PAG-B(2) | Polymer 9 (15) | TMGU (8.154) | PGMEA (1,109) | EL (2,587) |
| Example 12 | Polymer M (80) | PAG-A(8) PAG-B(2) | Polymer 9 (15) | TMGU (8.154) | PGMEA (1,109) | EL (2,587) |
| Example 13 | Polymer K (80) | PAG-A(8) PAG-B(2) | Polymer 10 (15) | TMGU (8.154) | PGMEA (1,109) | EL (2,587) |
| Example 14 | Polymer M (80) | PAG-A(8) PAG-B(2) | Polymer 10 (15) | TMGU (8.154) | PGMEA (1,109) | EL (2,587) |
| Example 15 | Polymer M (80) | PAG-A(8) PAG-B(2) | Polymer 11 (8) | TMGU (8.154) | PGMEA (1,109) | EL (2,587) |
| Example 16 | Polymer M (80) | PAG-A(8) PAG-B(2) | Polymer 12 (8) | TMGU (8.154) | PGMEA (1,109) | EL (2,587) |
| Example 17 | Polymer M (80) | PAG-A(8) PAG-B(2) | Polymer 13 (8) | TMGU (8.154) | PGMEA (1,109) | EL (2,587) |
| Example 18 | Polymer M (80) | PAG-A(8) PAG-B(2) | Polymer 14 (8) | TMGU (8.154) | PGMEA (1,109) | EL (2,587) |
| Example 19 | Polymer M (80) | PAG-A(8) PAG-B(2) | Polymer 15 (8) | TMGU (8.154) | PGMEA (1,109) | EL (2,587) |
| Example 20 | Polymer K (80) | PAG-A(8) PAG-B(2) | Polymer 16 (8) | TMGU (8.154) | PGMEA (1,109) | EL (2,587) |

*pbw: parts by weight

TABLE 4

| | Resin (pbw) | Acid generator (pbw) | Additive 1 (pbw) | Additive 2 (pbw) | Solvent 1 (pbw) | Solvent 2 (pbw) |
|---|---|---|---|---|---|---|
| Example 21 | Polymer M (80) | PAG-A(8) PAG-B(2) | Polymer 16 (8) | TMGU (8.154) | PGMEA (1,109) | EL (2,587) |
| Example 22 | Polymer M (80) | PAG-A(8) PAG-B(2) | Polymer 17 (4) | TMGU (8.154) | PGMEA (1,109) | EL (2,587) |
| Example 23 | Polymer K (80) | PAG-A(8) PAG-B(2) | Polymer 18 (4) | TMGU (8.154) | PGMEA (1,109) | EL (2,587) |
| Example 24 | Polymer M (80) | PAG-A(8) PAG-B(2) | Polymer 18 (4) | TMGU (8.154) | PGMEA (1,109) | EL (2,587) |
| Example 25 | Polymer M (80) | PAG-A(8) PAG-B(2) | Polymer 19 (2.0) | TMGU (8.154) | PGMEA (1,109) | EL (2,587) |
| Example 26 | Polymer K (80) | PAG-A(8) PAG-B(2) | Polymer 20 (2.0) | TMGU (8.154) | PGMEA (1,109) | EL (2,587) |
| Example 27 | Polymer M (80) | PAG-A(8) PAG-B(2) | Polymer 20 (2.0) | TMGU (8.154) | PGMEA (1,109) | EL (2,587) |
| Comparative Example 1 | Polymer K (80) | PAG-A(8) PAG-B(2) | Base-1 (1.25) Base-2 (0.3) | TMGU (8.154) | PGMEA (1,109) | EL (2,587) |
| Comparative Example 2 | Polymer M (80) | PAG-A(8) PAG-B(2) | Base-1 (1.25) Base-2 (0.3) | TMGU (8.154) | PGMEA (1,109) | EL (2,587) |

*pbw: parts by weight

EB Image Writing

Using a coater/developer system Clean Track ACT-M (Tokyo Electron Ltd.), each of the negative resist compositions (Examples 1 to 27 and Comparative Examples 1 and 2) was spin-coated onto a 152-mm square mask blank having a chromium oxynitride film at the outermost surface and pre-baked on a hot plate at 110° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 120° C. for 600 seconds, and developed with a 2.38 wt % tetramethylammonium hydroxide aqueous solution, thereby yielding negative patterns.

The patterned wafer was observed under a top-down scanning electron microscope (TDSEM). The optimum exposure (Eop) was defined as the exposure dose (μC/cm$^2$) which provided a 1:1 resolution at the top and bottom of a 200-nm 1:1 line-and-space pattern. The maximum resolution of the resist was defined as the minimum line width of a line-and-space pattern that could be resolved and separated at the optimum exposure. The LER of a 100-nm line-and-space pattern was measured under SEM. On observation in cross section of the resist pattern under SEM, it was visually judged whether or not the pattern profile was rectangular. Table 5 tabulates the test results of the inventive and comparative resist compositions on EB image writing.

TABLE 5

| | Eop (μC/cm$^2$) | Maximum resolution (nm) | LER (nm) | Pattern profile |
|---|---|---|---|---|
| Example 1 | 30 | 45 | 4.4 | rectangular |
| Example 2 | 31 | 40 | 4.5 | rectangular |
| Example 3 | 29 | 40 | 4.3 | rectangular |
| Example 4 | 32 | 40 | 4.4 | rectangular |
| Example 5 | 28 | 40 | 4.5 | rectangular |
| Example 6 | 30 | 40 | 4.0 | rectangular |
| Example 7 | 31 | 45 | 4.6 | rectangular |
| Example 8 | 29 | 40 | 4.2 | rectangular |
| Example 9 | 28 | 40 | 4.1 | rectangular |
| Example 10 | 30 | 45 | 4.3 | rectangular |
| Example 11 | 28 | 40 | 4.5 | rectangular |
| Example 12 | 28 | 40 | 4.6 | rectangular |
| Example 13 | 30 | 45 | 4.4 | rectangular |
| Example 14 | 29 | 45 | 4.8 | rectangular |
| Example 15 | 27 | 40 | 4.9 | rectangular |
| Example 16 | 30 | 40 | 4.6 | rectangular |
| Example 17 | 31 | 45 | 4.7 | rectangular |
| Example 18 | 29 | 40 | 4.4 | rectangular |
| Example 19 | 31 | 45 | 4.6 | rectangular |
| Example 20 | 30 | 45 | 4.5 | rectangular |
| Example 21 | 30 | 45 | 4.5 | rectangular |
| Example 22 | 29 | 40 | 4.8 | rectangular |
| Example 23 | 30 | 40 | 4.7 | rectangular |
| Example 24 | 29 | 45 | 4.6 | rectangular |
| Example 25 | 28 | 40 | 4.6 | rectangular |
| Example 26 | 29 | 45 | 4.9 | rectangular |
| Example 27 | 28 | 45 | 4.8 | rectangular |
| Comparative Example 1 | 31 | 55 | 5.7 | undercut |
| Comparative Example 2 | 32 | 55 | 5.8 | undercut |

It is evident from Table 5 that the resist compositions of Examples are improved in resolution and LER over those of Comparative Examples 1 and 2 when processed by EB lithography. The chemically amplified negative resist composition of the invention is suited as ultrafine pattern-forming material for VLSI fabrication and mask pattern-forming material by EB lithography.

Japanese Patent Application No. 2010-041472 is incorporated herein by reference.

Although some preferred embodiments have been described, many modifications and variations may be made thereto in light of the above teachings. It is therefore to be understood that the invention may be practiced otherwise

The invention claimed is:

1. A chemically amplified negative resist composition comprising (A) a base polymer which is soluble in an aqueous alkaline developer, (B) an acid generator capable of generating an acid catalyst, and (C) a nitrogen-containing compound as a basic component, said base polymer as component (A) turning alkali insoluble under the action of the acid catalyst in the presence or absence of a crosslinker, wherein a polymer comprising recurring units of a fluorinated carboxylic acid onium salt having the general formula (1) and having a weight average molecular weight of 1,000 to 50,000 is included as at least a portion of said base polymer,

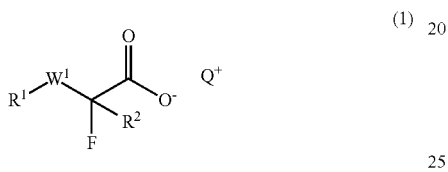
(1)

wherein $R^1$ is a structure derived from a basis skeleton capable of providing the polymerization activity of a polymerizable monomer, represented by any one of the formulae:

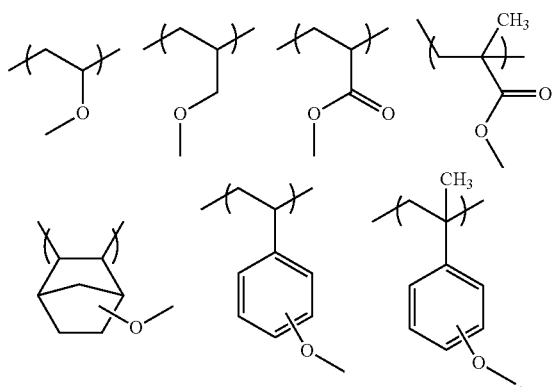

wherein the valence bond extending from the oxygen atom in the structure designates a bond to $W^1$, $R^2$ is fluorine or a fluoroalkyl group, $W^1$ is a divalent organic group, and $Q^+$ is a sulfonium cation of the general formula (a) or (b) or a iodonium cation of the general formula (c):

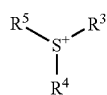
(a)

wherein $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom,

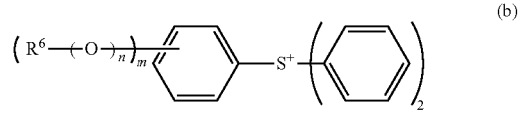
(b)

wherein $R^6$ is a substituted or unsubstituted, straight, branched or cyclic $C_1$-$C_{20}$ alkyl or alkenyl group or a substituted or unsubstituted $C_6$-$C_{14}$ aryl group, m is an integer of 1 to 5, n is 0 or 1, $R^6$ may have a carbonyl group, hydroxyl group, ester structure, lactone structure, amino group, amide group or ether-bonding oxygen atom substituted thereon,

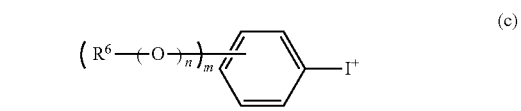
(c)

wherein $R^6$ is a substituted or unsubstituted, straight, branched or cyclic $C_1$-$C_{20}$ alkyl or alkenyl group or a substituted or unsubstituted $C_6$-$C_{14}$ aryl group, m is an integer of 1 to 5, n is 0 or 1, $R^6$ may have a carbonyl group, hydroxyl group, ester structure, lactone structure, amino group, amide group or ether-bonding oxygen atom substituted thereon.

2. The resist composition of claim 1 wherein the recurring units of a fluorinated carboxylic acid onium salt having the general formula (1) are recurring units of a fluorinated carboxylic acid onium salt having the general formula (2):

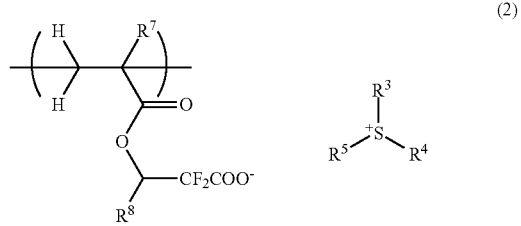
(2)

wherein $R^7$ is hydrogen or methyl, $R^8$ is hydrogen or $C_1$-$C_6$ alkyl, $R^3$, $R^4$ and $R^5$ are each independently a substituted or unsubstituted, straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^3$, $R^4$ and $R^5$ may bond together to form a ring with the sulfur atom.

3. The resist composition of claim 1, wherein the polymer comprising recurring units of a fluorinated carboxylic acid onium salt further comprises units having the general formula (3):

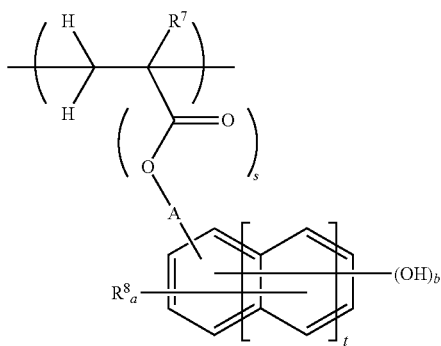

(3)

wherein $R^7$ is hydrogen or methyl, A is a single bond or a $C_1$-$C_{10}$ alkylene group which may be separated by an ether bond, $R^8$ is each independently hydrogen or $C_1$-$C_6$ alkyl, a is an integer of 0 to 4, b is an integer of 1 to 5, s is 0 or 1, and t is an integer of 0 to 2.

4. The resist composition of claim 1, wherein the polymer comprising recurring units of a fluorinated carboxylic acid onium salt further comprises units having the general formula (4):

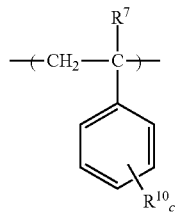

(4)

wherein $R^7$ is hydrogen or methyl, $R^{10}$ is selected from the group consisting of hydrogen, halogen, optionally halo-substituted $C_1$-$C_8$ alkyl or alkoxy groups, alicyclic groups, aromatic groups, and optionally halo-substituted $C_2$-$C_8$ alkylcarbonyloxy groups, and c is an integer of 1 to 5.

5. The resist composition of claim 1, further comprising a polymer free of recurring units of formula (1) as a portion of said base polymer.

6. The resist composition of claim 1, further comprising (D) a crosslinker which reacts with component (A) in the presence of the acid catalyst for turning component (A) alkali insoluble.

7. A pattern forming process comprising the steps of:
applying the negative resist composition of claim 1 onto a processable substrate to form a resist film,
exposing the film patternwise to high-energy radiation, and
developing the exposed film with an alkaline developer to form a resist pattern.

8. The process of claim 7 wherein the high-energy radiation is EUV or electron beam.

9. The process of claim 7 wherein the processable substrate comprises a chromium-containing material at the outermost surface.

10. The process of claim 7 wherein the processable substrate is a photomask blank.

* * * * *